(12) United States Patent
Fukaya et al.

(10) Patent No.: US 11,051,439 B2
(45) Date of Patent: Jun. 29, 2021

(54) POWER SUPPLY CONTROL DEVICE AND POWER SUPPLY CONTROL METHOD FOR COMPONENT SUPPLY DEVICE

(71) Applicant: FUJI CORPORATION, Chiryu (JP)

(72) Inventors: Yoshiyuki Fukaya, Chiryu (JP); Kazuya Matsuyama, Chiryu (JP); Hisato Sawanami, Kariya (JP); Toru Takahama, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 262 days.

(21) Appl. No.: 15/776,121

(22) PCT Filed: Nov. 30, 2015

(86) PCT No.: PCT/JP2015/083606
§ 371 (c)(1),
(2) Date: May 15, 2018

(87) PCT Pub. No.: WO2017/094070
PCT Pub. Date: Jun. 8, 2017

(65) Prior Publication Data
US 2018/0332746 A1     Nov. 15, 2018

(51) Int. Cl.
*H05K 13/00* (2006.01)
*H05K 13/04* (2006.01)
(Continued)

(52) U.S. Cl.
CPC ......... *H05K 13/0419* (2018.08); *G05B 15/02* (2013.01); *H05K 13/0885* (2018.08)

(58) Field of Classification Search
CPC .... G05B 13/00; H05K 13/00; H05K 13/0419; H05K 13/0417; H05K 13/02; H02J 50/00
(Continued)

(56) References Cited

U.S. PATENT DOCUMENTS 5,805,383 A * 9/1998 Yoshimura ........... G11B 15/442
                                                    360/137
6,701,611 B1   3/2004 Izumida et al.
(Continued)

FOREIGN PATENT DOCUMENTS

JP         3841585 B2    11/2006
JP       2007-48891 A    2/2007
(Continued)

OTHER PUBLICATIONS

International Search Report dated Mar. 1, 2016 in PCT/JP2015/083606 filed Nov. 30, 2015.

*Primary Examiner* — Rexford N Barnie
*Assistant Examiner* — Joseph N Inge
(74) *Attorney, Agent, or Firm* — Oblon, McClelland, Maier & Neustadt, L.L.P.

(57) ABSTRACT

A power supply control device for controlling a consumption current supplied from a power supply device to a tape feeder loaded on a component supply device, the component supply device being exchangeably loaded with multiple of the tape feeders, the power supply control device including: a consumption current acquiring section configured to acquire the consumption current corresponding to a state of the multiple tape feeders; a total consumption current calculating section configured to calculate a total consumption current that is a total of each of the consumption currents of the multiple tape feeders; and an operation controlling section configured to control the specified operation of the multiple tape feeders within a range in which the total consumption current does not exceed an output current capacity of the power supply device.

20 Claims, 11 Drawing Sheets

(51) Int. Cl.
*H05K 13/08* (2006.01)
*G05B 15/02* (2006.01)

(58) Field of Classification Search
USPC .......................................................... 307/31
See application file for complete search history.

(56) References Cited

U.S. PATENT DOCUMENTS

| | | | | |
|---|---|---|---|---|
| 9,820,420 | B2* | 11/2017 | Ohyama | ............ H05K 13/0417 |
| 2004/0143964 | A1 | 7/2004 | Izumida et al. | |
| 2012/0102343 | A1 | 4/2012 | Kondo et al. | |
| 2013/0028701 | A1* | 1/2013 | Sumi | .................. H05K 13/0215 |
| | | | | 414/806 |
| 2013/0331959 | A1* | 12/2013 | Kawai | .................. G05B 19/418 |
| | | | | 700/12 |
| 2014/0290055 | A1* | 10/2014 | Kurata | ................. H05K 13/085 |
| | | | | 29/832 |
| 2015/0110588 | A1 | 4/2015 | Ohyama et al. | |
| 2016/0205820 | A1* | 7/2016 | Ohashi | ............... H05K 13/0417 |
| | | | | 29/739 |
| 2017/0188492 | A1* | 6/2017 | Eguchi | ............... H05K 13/0417 |
| 2018/0049353 | A1* | 2/2018 | Michizoe | ........... H05K 13/0417 |
| 2018/0116079 | A1* | 4/2018 | Horaguchi | ....... G05B 19/41865 |
| 2018/0303014 | A1* | 10/2018 | Taniguchi | ............... H05K 13/08 |
| 2018/0332749 | A1* | 11/2018 | Matsuyama | ....... H05K 13/0885 |

FOREIGN PATENT DOCUMENTS

| | | | |
|---|---|---|---|
| JP | 2007-207976 A | | 8/2007 |
| JP | 2008-244162 A | | 10/2008 |
| JP | 2009-111113 A | | 5/2009 |
| JP | 2014-11315 A | | 1/2014 |
| JP | 2014165278 A | * | 9/2014 |
| WO | WO 2011/121934 A1 | | 10/2011 |

* cited by examiner

FIG. 5

| State\Type | Standby state (w) | Preparation state (p) | Operating state (m) |
|---|---|---|---|
| A | I(A, w) | I(A, p) | I(A, m) |
| B | I(B, w) | I(B, p) | I(B, m) |
| ⋮ | ⋮ | ⋮ | ⋮ |
| N | I(N, w) | I(N, p) | I(N, m) |

POWER SUPPLY CONTROL DEVICE AND POWER SUPPLY CONTROL METHOD FOR COMPONENT SUPPLY DEVICE

TECHNICAL FIELD

The present application relates to a power supply control device and power supply control method in a component supply device loaded with multiple exchangeable tape feeders, the device and method being for controlling the consumption current supplied from a power supply device to a loaded tape feeder.

BACKGROUND ART

As equipment for performing board production, there are solder printers, component mounters, reflow ovens, inspection machines, and so on. Conventionally, this equipment is connected to form a board production line. Such component mounters are provided with a board conveyance device, a component supply device, and a component transfer device on a base. With a component supply device having a typical configuration, in many cases multiple tape feeders that feed carrier tape are lined up in a row on the component supply device, with the component supply device being removably attached to a base. When such a component supply device is attached to the base, the component supply device is connected to a power supply device used for machine operations such that consumption current is supplied to each feeder.

There is a large gap between the consumption current for operation when the feeding motor of the tape feeder is operating to feed the carrier tape, and the consumption current when the feeder is on standby without the feeding motor operating. Also, there is a difference between the consumption current when operating and the consumption current during standby depending on the type of tape feeder. Here, when a component mounter is producing boards, cases do not arise in which a large quantity of tape feeders is operating simultaneously. Therefore, the output current capacity of the power supply device for machine operations is set to be appropriate for a case in which several tape feeders are operating simultaneously. On the other hand, there are cases in which a power supply device for external changeover is prepared such that changeover work can be performed in a state with the component supply device removed from the base. Technology related to a power supply of such a type of component supply device is disclosed in patent literature 1.

A component mounter of patent literature 1 is provided with a machine main body including multiple internal power supplies, and a component supply device loaded with an actuator (feeding motor). Further, the component mounter is provided with a connecting means on which is memorized identification information of the actuator, a control means for selecting the internal power supply based on the identification information, and a power supply switching means capable of switching the power supply path such that power is supplied to the component supply device from the selected internal power supply. Accordingly, it is possible to select one of the internal power supplies with a simple configuration in which a connecting means that memorizes identification information of actuators is provided, which means manufacturing costs are reduced. In other words, an internal power supply with an appropriate output current capacity is selected in accordance with the size of the consumption current of the actuator, and by reducing the capacity of cables and connectors, manufacturing costs are reduced.

CITATION LIST

Patent Literature

Patent literature 1: JP-2007-207976

BRIEF SUMMARY

Technical Problem

However, one of the causes of increased costs in patent literature 1 is the fact that there are multiple internal power supplies in the first place; having a single power supply device for machine operations is the most important thing for costs. However, recently a problem of output current capacity has arisen for power supply devices for machine operations that need to handle operation of several tape feeders.

In particular, during changeover work in which the type of component supplied from the tape feeder is changed, the feeding motor is operated in reverse, and unloading operation of ejecting the loaded carrier tape is performed. With a conventional tape feeder, it is necessary to press and hold an operation button to perform unloading operation, such that in general unloading operation is performed for two or fewer feeders at a time. In contrast, with a new type auto loading feeder, unloading operation is performed completely simply by pressing an operation button for a short time, meaning that unloading operation can be performed for many feeders at the same time. In such a case, a consumption current larger than that during board production flows, and there is a danger that the output current capacity of the power supply device for machine operations will become an excess current.

This problem may also occur for external changeover work that uses a power supply for external changeover. In fact, changing the component type for all the tape feeders that are loaded is more likely to apply to external changeover work, meaning that there is a large risk of excess current flowing in this case.

Also, with an auto loading feeder, changeover work is also performed while a component mounter is performing board work. That is, while a component mounter is operating, loading operation of loading the leading end of carrier tape, and the above unloading operation are performed. In such cases, if loading operation and unloading operation for a certain number of feeders, and component supply operation for another certain number of feeders overlap, this may lead to an excess current state.

The present disclosure takes account of such problems in the background art, and an object thereof is to provide a power supply control device and a power supply control method of a component supply device capable of enabling efficient changeover work of tape feeders by making sufficient use of output current capacity of the power supply within a range in which excess current does not occur.

Solution to Problem

A power supply control device of a component supply device of the present disclosure that solves the above problems is a device for controlling a consumption current supplied from a power supply device to a tape feeder loaded on the component supply device, the component supply device being exchangeably loaded with multiple of the tape feeders to which the consumption current is supplied and that perform a specified operation, the power supply control device including: a consumption current acquiring section configured to acquire the consumption current corresponding to a state of the multiple tape feeders loaded on the component supply device, based on a measured value or a design value; a total consumption current calculating section configured to calculate a total consumption current that is a total of each of the consumption currents corresponding to the multiple tape feeders; and an operation controlling section configured to control the specified operation of the multiple tape feeders within a range in which the total consumption current does not exceed an output current capacity of the power supply device.

Also, a power supply control method for a component supply device of the present disclosure is a method for controlling a consumption current supplied from a power supply device to multiple tape feeders, the component supply device being exchangeably loaded with multiple of the tape feeders to which the consumption current is supplied and that perform a specified operation, the power supply control method including: a consumption current acquiring step for acquiring the consumption current of each the multiple tape feeders based on a measured value or a design value; a total consumption current calculating step for calculating a total consumption current that is a total of the consumption currents of each the multiple tape feeders; and an operation controlling step for controlling the specified operation of the multiple tape feeders within a range in which the total consumption current does not exceed an output current capacity of the power supply device.

Advantageous Effects

A power supply control device of a component supply device of the present disclosure acquires a consumption current corresponding to a state of the multiple loaded tape feeders based on a measured value or a design value, calculates a total consumption current that is the sum of those consumption currents, and controls the specified operation of each of the tape feeders such that the total consumption current is within a range that does not exceed an output current capacity of the power supply device. Accordingly, it is possible to operate a large quantity of tape feeders such that the total consumption current is within a range that does not exceed the output current capacity, making it possible to efficiently perform changeover work of tape feeders while taking sufficient advantage of the output current capacity within a range that does not result in an excess current.

Also, the present disclosure may be realized as a power supply control method of a component supply device, in which the same effects as the above power supply control device of a component supply device of the present disclosure above are achieved.

BRIEF DESCRIPTION OF DRAWINGS

FIG. 5 is an example of a consumption current by state and type table held by a consumption current acquiring section of the first embodiment.

DESCRIPTION OF EMBODIMENTS

1. Overall Configuration of Component Mounter 9

Figure 1:
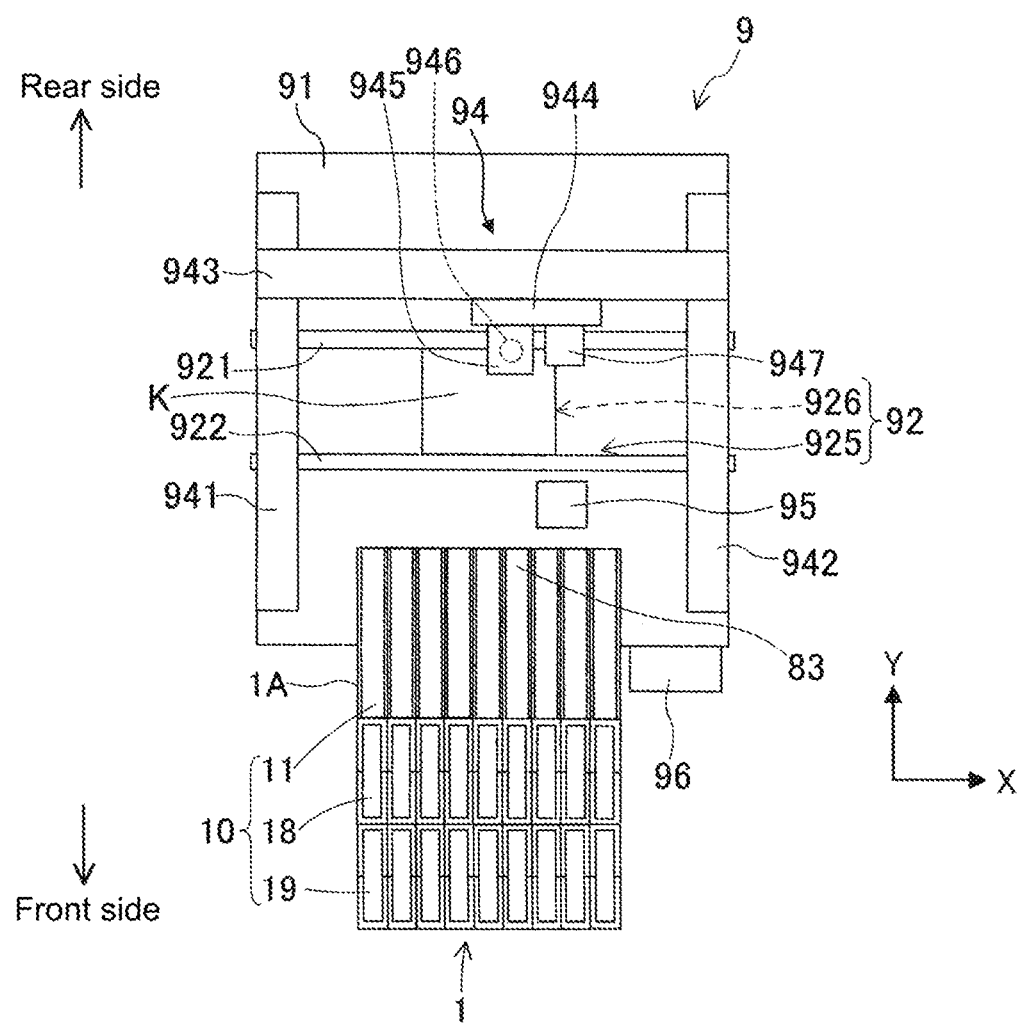
FIG. 1 is a plan view schematically showing the overall configuration of a component mounter that uses a power supply control device of a component supply device of a first embodiment of the present disclosure.

Power supply control device 2 of component supply device 1 of a first embodiment of the present disclosure will be described with reference to FIGS. 1 to 7. First, descriptions are given of the overall configuration of component mounter 9 that uses power supply control device 2 of component supply device 1 of a first embodiment of the present disclosure. FIG. 1 is a plan view schematically showing the overall configuration of component mounter 9. The direction from the left side of the page to the right side in FIG. 1 is the X-axis direction, in which board K is conveyed, and the direction from the front of the mounter at the bottom of the page to the rear of the mounter at the top of the page is the Y-axis direction. Component mounter 9 is configured from items such as board conveyance device 92, component supply device 1, component transfer device 94, component camera 95, and control device 96 assembled on base 91. Board conveyance device 92, component supply device 1, component transfer device 94, and component camera 95 are controlled from control device 96 such that each performs specified work.

Board conveyance device 92 loads board K to a mounting position, fixes board K in position, and unloads board K. Board conveyance device 92 is configured from conveyance unit 925 and backup unit 926. Conveyance unit 925 is configured from items such as pair of guide rails 921 and 922, and a pair of conveyor belts. The pair of guide rails 921 and 922 are assembled to base 91 parallel to each other and crossing a central upper surface of base 91. The pair of conveyor belts provided on the insides facing each other of the pair of guide rails 921 and 922 revolve with both edges of board K loaded on the conveyor belts, such that board K is loaded and unloaded to and from amounting position set in a center section of base 91. Backup unit 926 is arranged below the mounting position, and lifts board K and clamps it in a horizontal state.

Component supply device 1 is configured such that multiple feeders 10 are arranged in a row on approximately rectangular-shaped pallet member 1A that is removably attached to an upper surface of base 91. There are various sizes and types of tape feeders 10, with each having a different consumption current. Here, tape feeder 10 is assumed to be an auto loading feeder. Tape feeder 10 is configured from items such as main body section 11, and two supply reels, 18 and 19, arranged on a rear section of main body section 11. Wound on each supply reel 18 and 19 is carrier tape in which many electronic components are taped in a single row. The carrier tape is fed by a specified pitch each time to expose the stored electronic components and supply them consecutively.

Figure 2:
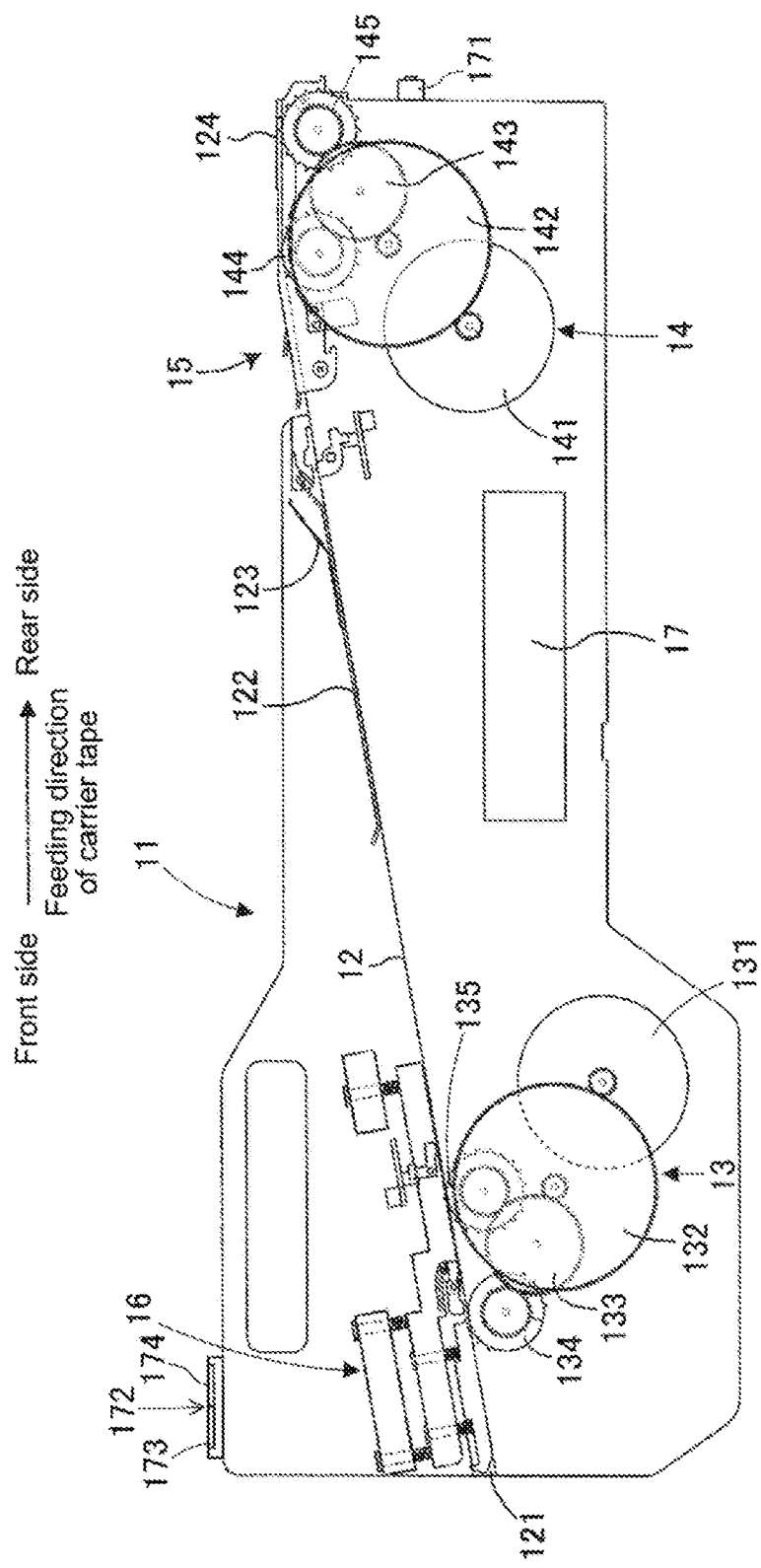
FIG. 2 is a side view cross section showing the internal configuration of a main body section of a tape feeder.

FIG. 2 is a side view cross section showing the internal configuration of main body section 11 of tape feeder 10. Tape feeder 10 is configured from items such as rail 12, front side tape feeding mechanism 13, rear side tape feeding mechanism 14, tape peeling mechanism 15, next tape control mechanism 16, and control section 17 assembled on two side plates that form main body section 11. The two side plates that form main body section 11 are arranged parallel and separated from each other, with the sideplate facing the reader in FIG. 2 not being shown.

Rail 12 is a member for guiding the feeding of carrier tape on an upper surface thereof. Rail 12 is arranged inclined from a roughly central height at the front side of main body section 11 to an upper portion at the rear of main body section 11. Insertion opening 121 formed at an upper side at the front end of rail 12 is formed such that carrier tapes pulled from the two supply reels 18 and 19 can be inserted overlapping. Lifting prevention member 122 is provided near a central portion in the lengthwise direction of rail 12. Lifting prevention member 122 presses the upper surface of rail 12 via torsion spring 123. Lifting prevention member 122 sandwiches the carrier tape against rail 12 such that the carrier tape can be fed while preventing the carrier tape from lifting. Component supply position 124 is provided on an upper surface near the rear end of rail 12.

Front side tape feeding mechanism 13 is provided on a lower section towards the front of rail 12. Front side tape feeding mechanism 13 is configured from items such as first feeding motor 131, first gear 132, second gear 133, first sprocket 134, and second sprocket 135. An output shaft of first feeding motor 131 is rotatably connected to first sprocket 134 and second sprocket 135 via first gear 132 and second gear 133 by way of gear coupling. Output teeth of first sprocket 134 and second sprocket 135 protrude upwards from a gap formed in rail 2 to engage with engaging holes the carrier tape.

Rear side tape feeding mechanism 14 is provided on a lower section towards the rear of rail 12. Rear side tape feeding mechanism 14 is configured from items such as second feeding motor 141, third gear 142, fourth gear 143, third sprocket 144, and fourth sprocket 145. An output shaft of second feeding motor 41 is rotatably connected to third sprocket 144 and fourth sprocket 144 via third gear 142 and fourth gear 143 by way of gear coupling. Output teeth of third sprocket 144 and fourth sprocket 145 protrude upwards from a gap formed in rail 12 to engage with engaging holes the carrier tape.

Tape peeling mechanism 15 is provided on an upper section towards the rear of rail 12, that is, on an upper side of rear side tape feeding mechanism 14. Tape peeling mechanism 15 peels cover tape 81 of carrier tape that is being fed from the carrier tape such that components P can be supplied at component supply position 124.

Next tape control mechanism 16 is provided on an upper section towards the front of rail 12, that is, on an upper side of front side tape feeding mechanism 13. Next tape control mechanism 16 controls feeding of two carrier tapes inserted overlapping into insertion opening 121 from the two supply reels 18 and 19. That is, next tape control mechanism. 16 allows the feeding of a first carrier tape that is currently in use, and holds the leading end of a second carrier tape to be used next. And, next tape control mechanism. 16 automatically starts feeding of the second carrier tape when the first carrier tape runs out, and allows the insertion of a third carrier tape.

Control section 17 is provided towards the bottom of main body section 12. Control section 17 is provided with items such as a microprocessor, memory, drivers, a communication section and so on, which are not shown, and operates by software. Tape feeder 10, when set on pallet member 1A, control device 17 and control device 96 are connected such that communication is possible via connector 171 provided on a rear surface of main body section 11. By this, control section 17 is able to exchange required information with control device 96. Note that, connector 171 also has the role of supplying electric power to tape feeder 10. Control device 17 controls first feeding motor 131 and second feeding motor 141 to perform a specified operation. A specified operation is the loading operation, the component supply operation, and the unloading operation, which are described below.

When carrier tapes of new supply reels 18 and 19 are used, an operator pulls the leading ends of the carrier tapes from supply reels 18 and 19, and inserts them into tape insertion opening 121 up to first sprocket 134. Then, by control from control device 17, first feeding motor 131 and second feeding motor 141 are rotated, such that the carrier tape is loaded. This operation of tape feeder 10 is loading operation. Also, by control from control device 17, first feeding motor 131 and second feeding motor are incrementally driven so as to pitch feed the carrier tape such that components are supplied. This operation of tape feeder 10 is component supply operation.

Further, in unloading operation of tape feeder 10, by control from control device 17, first feeding motor 131 and second feeding motor 141 are driven in reverse. This reverse rotates the first to fourth sprockets 134, 135, 144, and 145 such that the carrier tape is returned to the front of the feeder. Finally, the carrier tape is ejected as far as the front of first sprocket 134. By this, an operator can exchange used supply reels 18 and 19 for a new supply reel. Unloading operation is for collecting used carrier tapes, and many unloading operations need to be performed during changeover work that occurs when the type of board K being produced changes. At this time, if unloading operation is performed at a large number of tape feeders 10 at the same time, power supply devices 41 and 42 (refer to FIG. 3) are likely to suffer from an excess current state.

Operation panel 172 is arranged on a front upper section of main body section 11. Operation panel 172 is connect to and exchanges information with control device 17. Operation panel 172 includes command section 173 for receiving commands from an operator, and display section 174 for presenting information to an operator. An operator can issue instructions to tape feeders 10 for loading operation and unloading operation by pressing command buttons on command section 173.

Returning to FIG. 1, component transfer device 94 picks up an electronic component from each component supply position 124 of multiple tape feeders 10, transports the component to board K held at a fixed position and mounts the component on the board K. Component transfer device 94 is an XY robot type device that is capable of moving horizontally in the X-axis direction and the Y-axis direction. Component transfer device 94 is configured from pair of Y-axis rails 941 and 942, Y-axis slider 943, mounting head 944, nozzle tool 945, suction nozzles 946, board camera 947, and the like. The pair of Y-axis rails 941 and 942 are provided at the edges of base 91 and extend in the front-rear direction of base 91 (the Y-axis direction). Y-axis slider 943 is mounted on Y-axis rails 941 and 942 so as to be movable in the Y-axis direction.

Mounting head 944 is mounted on Y-axis slider 943 to be movable in the X-axis direction. Mounting head 944 is driven in the X-axis direction and Y-axis direction by two sets of ball screw mechanisms. Nozzle tool 945 is exchangeably held on mounting head 944. Nozzle tool 945 has one or multiple suction nozzles 946 that pick up a component and mount the component on board K. Board camera 947 is provided on mounting head 944 alongside nozzle tool 945. Board camera 947 images fiducial marks provided on board K to detect an accurate position of board K.

Component camera 95 is provided facing upwards on an upper surface of base 91 between board conveyance device 92 and component supply device 1. Component camera 95 images a state of an electronic component picked up by suction nozzle 946 as the component is moved from component supply device 1 to above board K by mounting head 944. When items such as deviations in the pickup position and rotation and so on of the electronic component are understood from the image data of component camera 95, control device 96 performs fine adjustments of component mounting operation as necessary.

Control device 96 stores amounting sequence that defines the order and types of electronic components to be mounted on board K and the tape feeders 10 that supply the electronic components. Control device 96 controls component mounting operation in accordance with the mounting sequence based on items such as image data of board camera 947 and component camera 95 and detection data of sensors, which are not shown. Also, control device 96 sequentially collects and updates operating data such as production quantity of completed boards K, mounting time required to mount the electronic components, and occurrences of component pickup errors.

Figure 3:
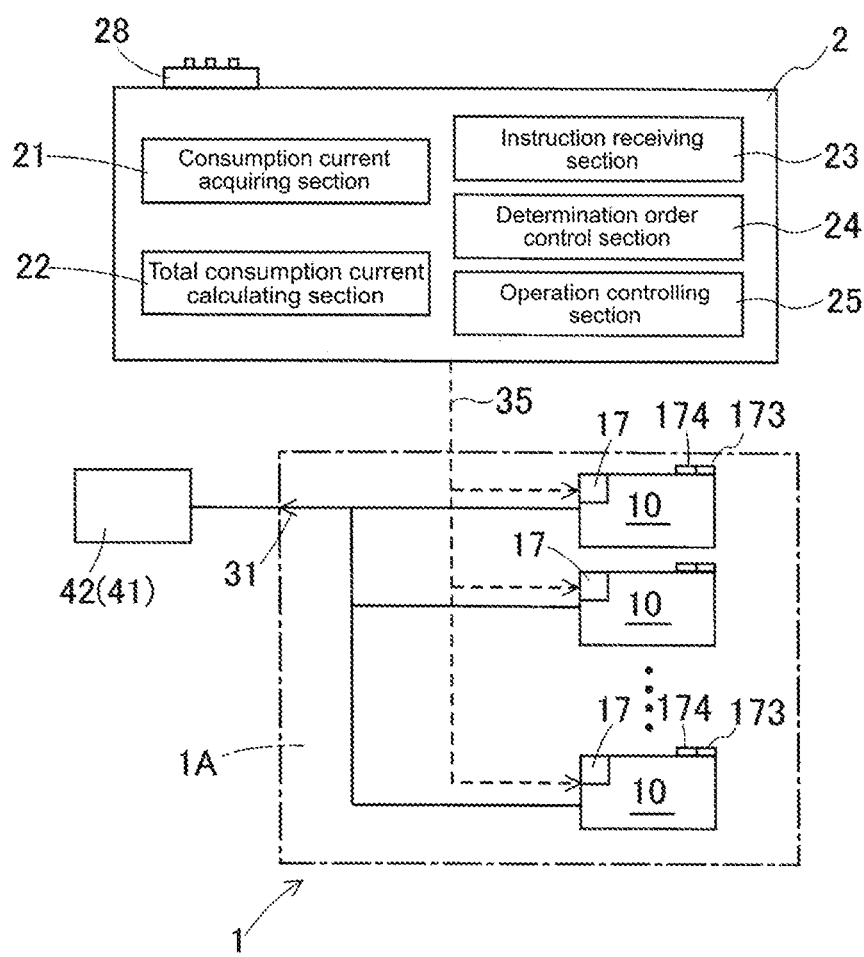
FIG. 3 is a block diagram illustrating the power supply control device of the component supply device of the first embodiment.

2. Configuration of Power Supply Control Device 2 of Component Supply Device 1 of a First Embodiment Turning to descriptions of power supply control device 2 of component supply device 1 of the first embodiment. FIG. 3 is a block diagram illustrating power supply control device 2 of component supply device 1 of the first embodiment. As shown, pallet member A1 includes power supplieside connector 31. Tape feeders 10 loaded on pallet member 1A are connected to power supplieside connector 31. When component supply device 1 is loaded on component mounter 9, power supplieside connector 31 is automatically connected to machine-operation-use power supply device 41. When component supply device 1 is removed from component mounter 9, power supplieside connector 31 can be connected to external-changeover-use power supply device 42. Output current capacity Icap of machine-operation-use power supply device 41 and changeover-use power supply device 42 is set appropriately to allow operation of multiple tape feeders 10.

Power supply control device 2 is a computer device with a CPU that runs software. Power supply control device 2 may be configured integrally with machine-operation-use power supply device 41, may be configured integrally with changeover-use power supply device 42, or may be configured as a standalone device. Also, there may be separate devices, a power supply control device configured integrally with machine-operation-use power supply device 41 and a power supply control device configured integrally with changeover-use power supply device 42. In the first embodiment, power supply control device 2 is configured integrally with changeover-use power supply device 42 and is used in external changeover work. As shown in FIG. 3, power supply control device 2 is provided with setting command section 28. Also, it is assumed that component supply device 1 is removed from component mounter 9 and is connected to external-changeover-use power supply device 42.

Power supply control device 2 is connected to control device 17 of each tape feeder 10 via control line 35, such that exchanging information is possible. Power supply control device 2 receives instructions based on commands entered to setting command section 28 and instructions based on commands of command section 173 of operation panel 172 of tape feeder 10. An example of an instruction based on commands entered to setting command section 28 is an all-at-once instruction to perform unloading operation at all loaded tape feeders 10. An example of an instruction based on commands of command section 173 of tape feeder 10 is an individual instruction for tape feeder 10 to perform loading operation or unloading operation.

Power supply control device 2 is provided with consumption current acquiring section 21, total consumption current calculating section 22, instruction receiving section 23, determination order control section 24, and operation controlling section. Each functional section 21 to 25 runs on software. Instruction receiving section 23 receives instructions given to setting command section 28 and command section 173. In other words, instruction receiving section 23 receives an individual instruction for any one of the loaded tape feeders 10 to perform a specified operation, and an all-at-once instruction for all of the loaded tape feeders 10 to perform a specified operation. Command section 173 is an embodiment of an individual instruction receiving section of the present disclosure that receives an individual instruction via an operation command and sends the instruction to operation controlling section 25.

Consumption current acquiring section 21 acquires a consumption current corresponding to a state of the multiple tape feeders 10 loaded on component supply device 1 based on a measured value or a design value. A consumption current value may be a design value or a pre-measured measurement value. Total consumption current calculating section 22 calculates total consumption current Itot that is the sum of the consumption currents corresponding to the states of the multiple tape feeders 10. Determination order control section 24 holds determination order k that determines whether to perform the specified operation at the multiple tape feeders 10. Determination order control section 24 sets the order in which to instruct tape feeders 10 to perform operation according to determination order k when instruction receiving section 23 receives multiple individual instructions at the same time or when instruction receiving section 23 receives an all-at-once instruction. Operation controlling section 25 controls a specified operation of multiple tape feeders 10 such that total consumption current Itot is within a range that does not exceed output current capacity Icap of power supply devices 41 and 42. Details of functions and operation of consumption current acquiring section 21, total consumption current calculating section 22, determination order control section 24, and operation controlling section 25 are described later.

Figure 4:
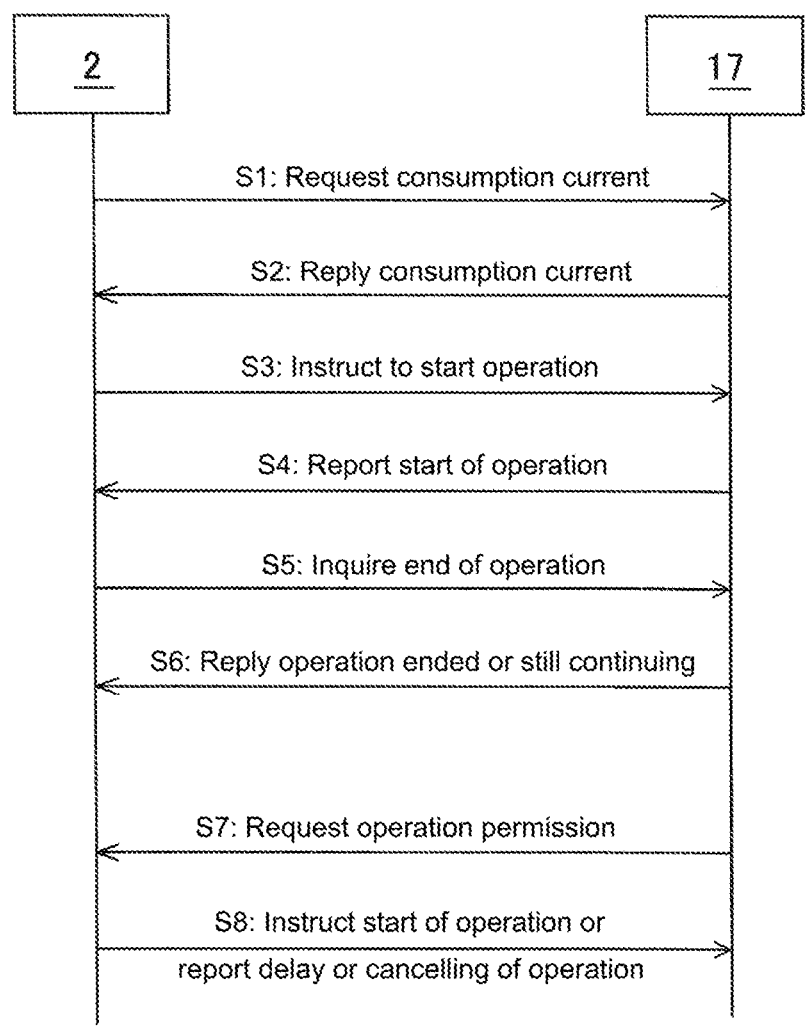
FIG. 4 illustrates the operation flow performed by the control section of the tape feeder and the power supply control device via control wires.

3. Operation of Power Supply Control Device 2 of Component Supply Device 1 of a First Embodiment Turning to descriptions of operation of power supply control device 2 of component supply device 1 of the first embodiment. First, descriptions are given of the operation flow between power supply control device 2 and a specific tape feeder 10. FIG. 4 illustrates the operation flow performed by control section 17 of tape feeder 10 and power supply control device 2 via control wires 35. Power supply control device 2 is on the left of FIG. 4 and control device 17 of tape feeder 10 is on the right, with the operation flow being shown by the directions of the horizontal arrows. Note that, operations of FIG. 4 are also performed the same way when component supply device 1 is loaded on component mounter 9.

In step S1 of FIG. 4, consumption current acquiring section 21 of power supply control device 2 requests control device 17 of tape feeder 10 for the consumption current. In step 2, control device 17 replies to consumption current acquiring section 21 with the consumption current.

Here, the consumption current simply depends on the state of the tape feeder 10. That is, in a standby state in which tape feeder 10 is not performing the specified operation, control device 17 and sensors that are not shown are operating. Only a small standby consumption current flows in a tape feeder 10 in a standby state. Further, in a preparation state in which tape feeder 10 is preparing to perform the specified operation, in addition to operation of control device 17, first feeding motor 131 and second feeding motor 141 are energized (voltage is applied, but the motors are not rotating). Preparation consumption current flows in a tape feeder 10 in a preparation state. Further, in an operating state in which tape feeder 10 is performing the specified operation, in addition to operation of control device 17, first feeding motor 131 and second feeding motor 141 are rotating. A large operating consumption current flows in a tape feeder 10 in an operating state.

Also, the consumption current depends on the type of tape feeder 10. For example, with a tape feeder 10 for wide carrier tape that holds relatively large components, naturally, a large consumption current flows. In the first embodiment, control device 17 of each tape feeder 10 memorizes a value of the standby consumption current, the preparation consumption current, and the operating consumption current of the tape feeder 10 itself. These current values may be pre-measured measurement values, or design values. Note that, descriptions hereinafter assume that the operating consumption current is the same during loading operation, component supply operation, and unloading operation. To improve accuracy, different operating consumption current values may be used for each operation.

Consumption current acquiring section 21 determines or supposes which of the standby state, the preparation state, and the operating state the multiple tape feeders 10 are in, and acquires the corresponding one of the standby consumption current, preparation consumption current, and the operating consumption current. Here, the state of the tape feeders 10 is not limited to the current state, it includes a supposed state. Specifically, consumption current acquiring section 21 performs communication with each loaded tape feeder 10 and receives a value of a consumption current corresponding to the current state from the tape feeders 10 with which communication was performed, or a value of an operating consumption current corresponding to a case supposing an operating state in which the specified operation is being performed.

Note that, consumption current acquiring section 21 may be a first or a second embodiment described below. The consumption current acquiring section of the first embodiment holds a consumption current by state and type table that shows the relationship between consumption currents and types of states of tape feeders 10. FIG. 5 is an example of a consumption current by state and type table held by a consumption current acquiring section of the first embodiment. As shown, types A to N are given in the left column, a standby state (w), a preparation state (p), and an operating state (m) are given in subsequent columns, with a value for the consumption current being given in each corresponding cell of the table. For example, for a type A tape feeder 10, the standby consumption current is I(A, w), the preparation consumption current is I(A, p), and the operating consumption current is I(A, m).

The consumption current acquiring section of the first embodiment requests the type and current state of the loaded tape feeders 10, and receives a reply from the requested tape feeders of their types and current states. Alternatively, the consumption current acquiring section of the first embodiment supposes an operating state in which the loaded tape feeders 10 are performing the specified operation, requests the type of the loaded tape feeders 10, and receives a reply of the types from the requested tape feeders 10. By this, the consumption current acquiring section of the first embodiment can reference the received replies with the consumption current by state and type table to acquire a consumption current corresponding to the state of the requested tape feeders 10.

Also, a consumption current acquiring section of the second embodiment uses an identification code of the tape feeders 10 instead of the type, and acquires the consumption current by requesting and receiving in a similar manner as to the first embodiment. The consumption current acquiring section of the second embodiment holds the relationships between the consumption currents, states, and identification codes that identify individual tape feeders 10 in the consumption current by state and individual unit table. The consumption current by state and individual unit table is the consumption current by state and type table of FIG. 5 with the type column replaced by an identification code column. In the second embodiment, in a case in which there are individual differences in the consumption currents even for the same type of tape feeder 10, the consumption currents can be acquired with more accuracy than with the first embodiment.

Returning to FIG. 4, in step S3 when instruction receiving section 23 received an individual instruction or an all-at-once instruction, operation controlling section 25 instructed control device to start operation. Control device 17, when first feeding motor 131 and second feeding motor 141 start rotating, sends a notice that operation has started to operation controlling section 25. In step S5, operation controlling section 25 inquires with control device 17 whether operation has ended. In step S6, control device 17 replies to operation controlling section 25 that operation has ended or that operation is still being performed.

Also, in step S7 when an individual instruction for a loading operation or an unloading operation occurs due to a command of an operator via command section 173, control device 17 requests to operation controlling section 25 to allow operation via instruction receiving section 23. In step S8, in a case in which total consumption current Itot is sufficiently lower than output current capacity Icap, operation controlling section 25 instructs control device 17 to start operation.

However, in step S8, in a case in which total consumption current Itot is not sufficiently lower than output current capacity Icap, operation controlling section 25 instructs control device 17 to delay or cancel operation. Here, control device 17 notifies an operator by displaying an indication of the delay or cancellation of operation on display section 174. Display section 174 is an embodiment of the notification section of the present disclosure that notifies an operator of a delay or a cancellation to the specified operation in a case in which an operator command has been issued and the specified operation has been stopped by operation controlling section 25. Note that, when total consumption current Itot is sufficiently lower than output current capacity Icap, it is desirable for operation controlling device 25 to instruct control device 17 to start operation as soon as total consumption current Itot has been reduced sufficiently.

Figure 6:
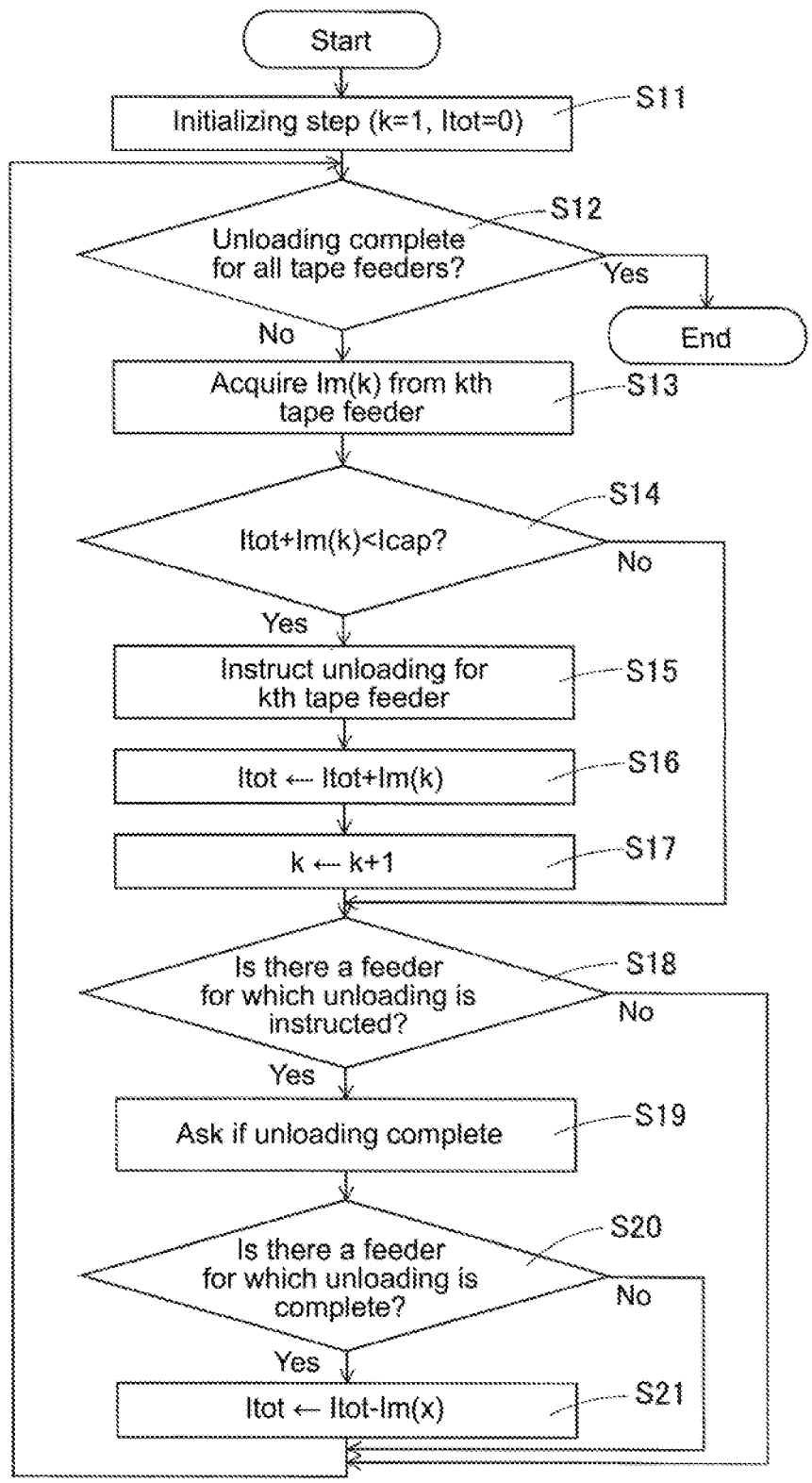
FIG. 6 is a flowchart of operation of the power supply control device of the first embodiment that performs unloading operation of multiple tape feeders during external changeover work.

Described next is operation of power supply control device 2 in a case of performing unloading operation of multiple tape feeders 10 during external changeover work. This operation is started after instruction receiving section 23 receives an all-at-once instruction for unloading operation via a command entered to setting command section 28. FIG. 6 is a flowchart of operation of power supply control device 2 of the first embodiment that performs unloading operation of multiple tape feeders 10 during external changeover work. To simplify descriptions, the time in which preparation consumption current arises is assumed to be short and is omitted, and standby consumption current is assumed to be zero. Also, determination order k that determines whether to perform unloading operation of multiple tape feeders 10 is assumed to be held in advance by determination order control section 25. Determination order k, for example, may be the order in which tape feeders 10 are lined up on pallet table 1A, but is not limited to this.

In initialization step S11 of FIG. 6, determination order control section 25 sets the kth tape feeder 10 for which to perform determining and the initial value of determination order k as k=1. Also, total consumption current calculating section 22 sets the initial value of the total consumption current Itot as Itot=0. In step S12, operation controlling section 25 determines whether unloading operation is complete for all tape feeders 10. For the first time step S12 is performed, because this is not complete, processing proceeds to step S13. In step S13, consumption current acquiring section 21 acquires operating consumption current Im(k) from kth tape feeder 10. Step S13 supposes that tape feeder 10 is performing the specified operation, such that a corresponding operating consumption current is acquired. The first time step S13 is performed, consumption current acquiring section 21 acquires operating consumption current Im(1) from 1st tape feeder 10.

In step S14, operation controlling section 25 determines whether the sum of total consumption current Itot and operating consumption current Im(k) is smaller than output current capacity Icap. The first time step S14 is performed, the sum is smaller than output current capacity Icap, so processing proceeds to S15. In step S15, operation controlling section 25 issues an instruction to the kth tape feeder 10 to start unloading operation. The first time step S15 is performed, operation controlling section 25 issues an instruction to the 1st tape feeder 10 to start unloading operation. In step S16, total consumption current calculating section 22 adds operation consumption current Im(k) to total consumption current Itot and updates total consumption current Itot. In step S17, determination order control section 25 increments determination order k by one and proceeds to the determination of the next tape feeder 10.

In step S18, operation controlling section 25 determines whether there are tape feeders 10 for which the unloading operation instruction is complete. The first time step S18 is performed, there are no such feeders, so processing returns to step S12. Accordingly, by repeating steps 12 to S18, operation controlling section 25 issues an instruction to tape feeders 10 to start unloading operation for a quantity of feeders equal to the number of times the steps are repeated. Here, the total consumption current Itot gradually increases, and in step S14, the total consumption current Itot is no longer sufficiently smaller than the output current capacity Icap. When this occurs, steps S15 to S17 are no longer performed.

When step S18 is performed for the second time and onwards, there is a tape feeder 10 for which an instruction for unloading operation has been performed, so processing proceeds to S19. In step S19, operation controlling section 25 asks whether operation is complete for the tape feeder 10 for which the instruction for unloading operation had been issued. In step S20, operation controlling section 25 confirms whether there is an xth tape feeder for which unloading operation is complete. When there is an xth tape feeder in step S21, total consumption current calculating section 22 subtracts operating consumption current Im(x) of the xth tape feeder from total consumption current Itot and updates the total consumption current Itot. If there are no xth tape feeders after step S21 and during step 20, processing returns to step S12.

According to the above operation flow, operation controlling section 25 performs unloading operation of each of the loaded tape feeders 10 in accordance with determination order k such that total consumption current Itot is within a range that does not exceed output current capacity Icap of external changeover power supply devices 42. Then, in step S12, when unloading operation of multiple tape feeders 10 is complete, that is, when the value of determination order k has become larger than the quantity of loaded tape feeders 10, operation of power supply control device 2 also ends.

Note that, when considering the standby operating current, in step S11, as an initial value of total consumption current Itot, the sum of the standby operating current of multiple tape feeders 10 is used. Further, in step S14, instead of operating consumption current Im(k), the increased current amount calculated by subtracting the standby consumption current from the operating consumption current is used.

With conventional technology, a configuration is used that allows unloading operation of tape feeders 10 according to individual requests. Thus, if many individual requests occur at the same time, there is potential for an excess current state to occur. Also, with conventional technology, in a case in which there are all-at-once requests or many individual requests for unloading operation, to avoid an excess current state, the configuration may be such that unloading operation is only allowed for a fixed quantity (for example, two) of tape feeders 10. However, because the consumption current depends on the type of tape feeder 10, there may be cases in which operation is actually possible for more than the fixed quantity (for example, three or more feeders), meaning that operation is inefficient.

With respect to conventional technology, in the first embodiment, unloading operation is allowed for the maximum quantity of tape feeders 10 that is allowed. Thus, efficiency of changeover work is improved, and changeover work can be finished in a shorter time compared to conventional technology.

Descriptions related to the operation flow of FIG. 4 and the operation flow of FIG. 6 are similar to the descriptions of the power supply control method of component supply device 1 of an embodiment of the disclosure. That is, steps S1 and step S2 of FIG. 4, and step S13 of FIG. 6 correspond to each of the consumption current acquiring steps based on a design value or a measured value of the consumption current of each loaded tape feeder 10. Also, step S16 of FIG. 6 corresponds to the total consumption current calculating step of calculating total consumption current Itot by adding the consumption currents Im(k) of each of the loaded tape feeders 10. Further, step S8 of FIG. 4, and steps S14 and S15 of FIG. 6 correspond to the operation controlling step of controlling the specified operation of each loaded tape feeder 10 within a range that does not exceed output current capacity Icap of power supply device 42.

Figure 7:
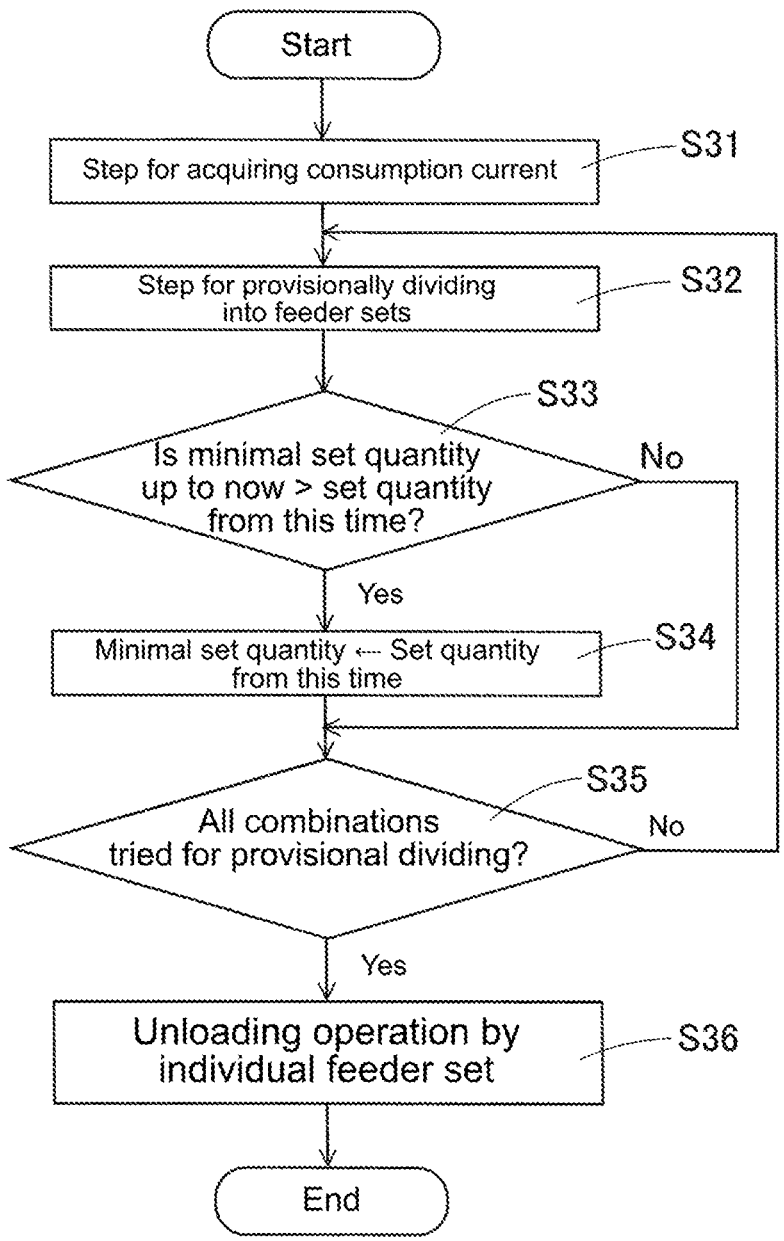
FIG. 7 is a flowchart of operation applied to the power supply control device of the first embodiment that performs unloading operation of multiple tape feeders during external changeover work.

4. Application of Power Supply Control Device 2 of Component Supply Device 1 of a First Embodiment An application of power supply control device 2 of component supply device 1 of the first embodiment is described next. In this application, when unloading operation of multiple tape feeders 10 is performed during external changeover work, instead of performing work in accordance with predetermined determination order k, the setting configuration of tape feeders 10 to be operated at the same time is optimized. FIG. 7 is a flowchart of operation applied to the power supply control device 2 of the first embodiment that performs unloading operation of multiple tape feeders 10 during external changeover work.

In consumption current acquiring step S31 of FIG. 7, total consumption current acquiring section 21 operates to acquire the standby consumption current and the operating consumption current of multiple tape feeders 10. In the subsequent feeder setting provisional allocation step S2, operation controlling section 25 performs provisional division by dividing multiple tape feeders 10 into multiple feeder setting sets configured from at least two tape feeders 10. Here, a condition related to current must be satisfied, that is, total consumption current Itot must not exceed output current capacity Icap. Specifically, total consumption current calculating section 22 calculates total consumption current Itot and checks that the condition related to current is satisfied.

For example, assuming a case in which the multiple tape feeders 10 are provisionally divided into first to fifth feeder sets. Total consumption current calculating section 22 adds together the operating consumption currents of tape feeders 10 of the first feeder set, then further adds the standby consumption current of the tape feeders 10 of the second to fifth feeder sets to obtain the total consumption current Itot. The total consumption current calculating section 22 also assumes cases in which tape feeders 10 of second to fifth feeder sets are performing unloading operation, and obtains the total consumption current each time by similar calculation. If all of the five obtained total consumption currents Itot values are equal to or less than output current capacity Icap, the condition related to current is satisfied.

In step S33, operation controlling section 25 determines whether the quantity of feeder sets obtained from this provisional dividing is smaller than the minimal set quantity obtained until this point. If the quantity obtained this time is smaller, in step S34, the minimal set quantity is replaced with the quantity of sets obtained this time. In step S35, operation controlling section 25 determines whether all combinations of provisional division of multiple tape feeders 10 have been attempted. If not all combinations have been attempted, the provisional division combination is changed and processing returns to step S32. There are many provisional division combinations that satisfy the condition related to current, and the loop of steps S32 to S35 is performed repeatedly using trial and error.

In step S35, if it is determined that all the combinations of provisional divisions have been attempted, processing exits the loop and proceeds to step S36. In step S36, operation controlling section 25 performs unloading operation in order of individual feeder set based on the minimal set quantity obtained in the final performance of step S34. As described above, operation controlling section 25 includes an unloading optimizing section of the present disclosure that optimizes the combination of tape feeders 10 that configure each feeder set.

Operation of power supply control device 2 of this application and the first embodiment described above is effective when performing unloading operation for not all, but a large quantity of tape feeders 10. Also, even if component supply device 1 is loaded on component mounter 9 and connected to machine-operation-use power supply device 41, in a case in which changeover work is performed after stopping operation of component mounter 9, operation of power supply control device 2 of this application and the first embodiment described above can be performed in a similar manner.

5. Form and Effects of Power Supply Control Device 2 of Component Supply Device 1 of First Embodiment Power supply control device 2 of component supply device 1 of the first embodiment is for controlling a consumption current supplied from a power supply device (changeover-use power supply device) to a tape feeder 10 loaded on the component supply device 1, the component supply device 1 being exchangeably loaded with multiple of the tape feeders 10 to which the consumption current is supplied and that perform a specified operation, power supply control device 2 including: consumption current acquiring section 21 configured to acquire the consumption current corresponding to a state of the multiple tape feeders 10 loaded on the component supply device 1, based on a measured value or a design value; total consumption current calculating section 22 configured to calculate a total consumption current that is a total of each of the consumption currents corresponding to the multiple tape feeders 10; and operation controlling section 25 configured to control the specified operation of the multiple tape feeders 10 within a range in which the total consumption current does not exceed an output current capacity of the power supply device.

Accordingly, it is possible to operate a large quantity of tape feeders 10 such that the total consumption current Itot is within a range that does not exceed the output current capacity Icap, making it possible to efficiently perform changeover work of tape feeders 10 while taking sufficient advantage of the output current capacity Icap within a range that does not result in an excess current. On the other hand, the output current capacity Icap can be made appropriate, also helping to lower costs of the power supply device. Further, because it is not necessary to actually measure the consumption current, the configuration of power supply control device 2 can be simple, also helping to lower costs.

Further, the consumption current corresponding to the state of the tape feeder 10 includes a standby consumption current corresponding to a standby state in which the specified operation is not being performed, a preparation consumption current corresponding to a preparation state of preparing for the specified operation, and an operating consumption current corresponding to an operating state in which the specified operation is being performed, and consumption current acquiring section 21 determines or supposes which of the standby state, the preparation state, and the operating state the multiple tape feeders 10 are in, and acquires the corresponding one of the standby consumption current, preparation consumption current, and the operating consumption current. Accordingly, by distinguishing between the three types of consumption currents, it is possible to reliably calculate the total consumption current Itot to be in a range that does not exceed the output current capacity Icap, thus improving the ability to get the most out of the output current capacity Icap.

Further, power supply control device 2 is further provided with instruction receiving section 23 configured to receive at least one of an individual instruction for performing the specified operation at one of the multiple tape feeders 10, or an all-at-once instruction for performing the specified operation at all of the multiple tape feeders 10. Accordingly, even if the states of performing operation of the multiple tape feeders 10 change in various ways, each of the above effects can be realized to a great extent.

Further, power supply control device 2 also includes: determination order control section 24 configured to hold a determination order k that determines whether the specified operation of the multiple tape feeders 10 is to be performed, and to set an order in which to instruct the tape feeders to perform the operation based on the determination order k when instruction receiving section 23 has received multiple of the individual instructions at the same time or has received the all-at-once instruction, wherein consumption current acquiring section 21 is configured to acquire the operating consumption current corresponding to a supposed operation state when the specified operation is being performed by the tape feeders 10 instructed to perform the operation, and to acquire the consumption current corresponding to a current state of the other tape feeders 10, total consumption current calculating section 22 is configured to calculate the total consumption current by adding together the operating consumption current of the tape feeders 10 instructed to perform the operation, and the consumption current corresponding to the current state of the other tape feeders 10, and operation controlling section 25 is configured to perform the specified operation of the tape feeders 10 instructed to perform the operation if the total consumption current Itot is equal to or less than the output current capacity Icap, and to not perform the specified operation of the tape feeders instructed to perform the operation if the total consumption current Itot exceeds the output current capacity Icap.

Accordingly, it is possible to effectively determine whether to allow tape feeders 10 to perform the specified in accordance with the pre-held determination order k.

Further, tape feeders 10 include an individual instruction receiving section (command section 173) configured to receive an individual instruction via an operator command and send the individual instruction to operation controlling section 25, and a notification section (display section 174) configured to notify the operator of a delay or a cancellation to the specified operation in a case in which the operator command has been issued and the specified operation has been stopped by operation controlling section 25. Accordingly, in a case in which a tape feeder 10 does not operate even when requested to by a command, the operator can understand the reason.

Further, consumption current acquiring section 21 performs communication with the multiple tape feeders 10 and receives a value of a consumption current corresponding to the current state from the tape feeders 10 with which communication was performed, or a value of an operating consumption current corresponding to a case supposing an operating state in which the specified operation is being performed. Accordingly, because the tape feeder 10 itself holds the consumption current value, even if a tape feeder 10 is exchanged, there will be no mistake with the value of the consumption current to be used.

Also, the consumption current acquiring section of the first embodiment is configured to hold a consumption current by state and type table showing relationships between unit types of the tape feeders 10, the states of the tape feeders 10, and the consumption currents of the tape feeders 10, request the multiple tape feeders 10 for the unit type and the current state and receive a reply from the requested tape feeders 10 of the unit type and the current state, or, suppose an operating state of the multiple tape feeders 10 performing the specified operation, request the multiple tape feeders 10 for the unit type of the tape feeders, and receive a reply from the requested tape feeders 10 of the unit type, and reference the received reply with the consumption current by state and type table, and acquire the consumption current corresponding to the state of the requested tape feeders. Accordingly, because all that is required is managing consumption current values by each type of tape feeder 10, it is easy.

Further, the consumption current acquiring section of the second embodiment is configured to hold a consumption current by state and individual unit table showing relationships between identification codes that identify individual units of the tape feeders 10, the states of the tape feeders 10, and the consumption currents of the tape feeders 10, request the multiple tape feeders 10 for the identification code and the current state and receive a reply from the requested tape feeders 10 of the identification code and the current state, or, suppose an operating state of the multiple tape feeders 10 performing the specified operation, request the multiple tape feeders 10 about the identification code of the tape feeders 10, and receive a reply from the requested tape feeders 10 of the identification code, and reference the received reply with the consumption current by state and individual unit table, and acquire the consumption current corresponding to the state of the requested tape feeders 10. Accordingly, in a case in which there are individual differences in the consumption currents even for the same type of tape feeder 10, the consumption currents can be acquired with more accuracy than with the first embodiment.

Further, tape feeder 10 includes first feeding motor 131 and second feeding motor 141 configured to feed carrier tape with tape electronic components from a supply reel, and the specified operation includes unloading operation of ejecting the carrier tape from the tape feeder 10 by reverse-driving first feeding motor 131 and second feeding motor 141. Accordingly, when performing unloading operation at multiple tape feeders 10 during changeover work, the above effects are realized to a great extent.

Further, in an application of the first embodiment, operation controlling section 25, in a case of performing the unloading operation at multiple of the tape feeders 10, divides the multiple tape feeders 10 into feeder sets configured from at least two tape feeders 10, and makes it such that total consumption current Itot obtained by adding together the operating consumption current corresponding to the operating state when the tape feeders 10 in one of the feeder sets are performing the unloading operation, and the standby consumption current corresponding to the standby state when the tape feeders of another of the feeder sets are not performing the unloading operation is in a range that does not exceed the output current capacity Icap, and performs the unloading operation in individual order of the feeder sets. Accordingly, without using determination order k, it is possible to set multiple tape feeders 10 and to perform unloading operation at the same time.

Further, operation controlling section 25 includes an unloading optimizing section of the present disclosure that optimizes the combination of tape feeders 10 that configure each feeder set. Accordingly, it is possible to optimize the feeder sets of tape feeders 10 performing unloading operation at the same time, and the effect of efficiently performing changeover work can be realized to a great extent.

Further, the power supply device is machine-operation-use power supply device 41 inside component mounter 9 in a case in which component supply device 1 is loaded on component mounter 9, and is changeover-use power supply device 42 in a case in which component supply device 1 is removed from component mounter 9. Accordingly, the above effects are realized for both internal changeover work and external changeover work.

Also, a power supply control method for component supply device 1 of an embodiment of the present disclosure is a method for controlling a consumption current supplied from a power supply device (changeover-use power supply device 42) to multiple tape feeders 10, component supply device 1 being exchangeably loaded with multiple of the tape feeders 10 to which the consumption current is supplied and that perform a specified operation, the power supply control method including: a consumption current acquiring step (steps S1, S2, and S13) for acquiring the consumption current of each the multiple tape feeders 10 based on a measured value or a design value; a total consumption current calculating step (step S16) for calculating a total consumption current that is a total of the consumption currents of each the multiple tape feeders 10; and an operation controlling step (S8, S14, and S15) for controlling the specified operation of the multiple tape feeders 10 within a range in which the total consumption current Itot does not exceed the output current capacity Icap of the power supply device.

The present disclosure may be realized as the power supply control method of component supply device 1 of the present embodiment, in which the same effects as the above power supply control device 2 component supply device 1 of the first embodiment are achieved.

Figure 8:
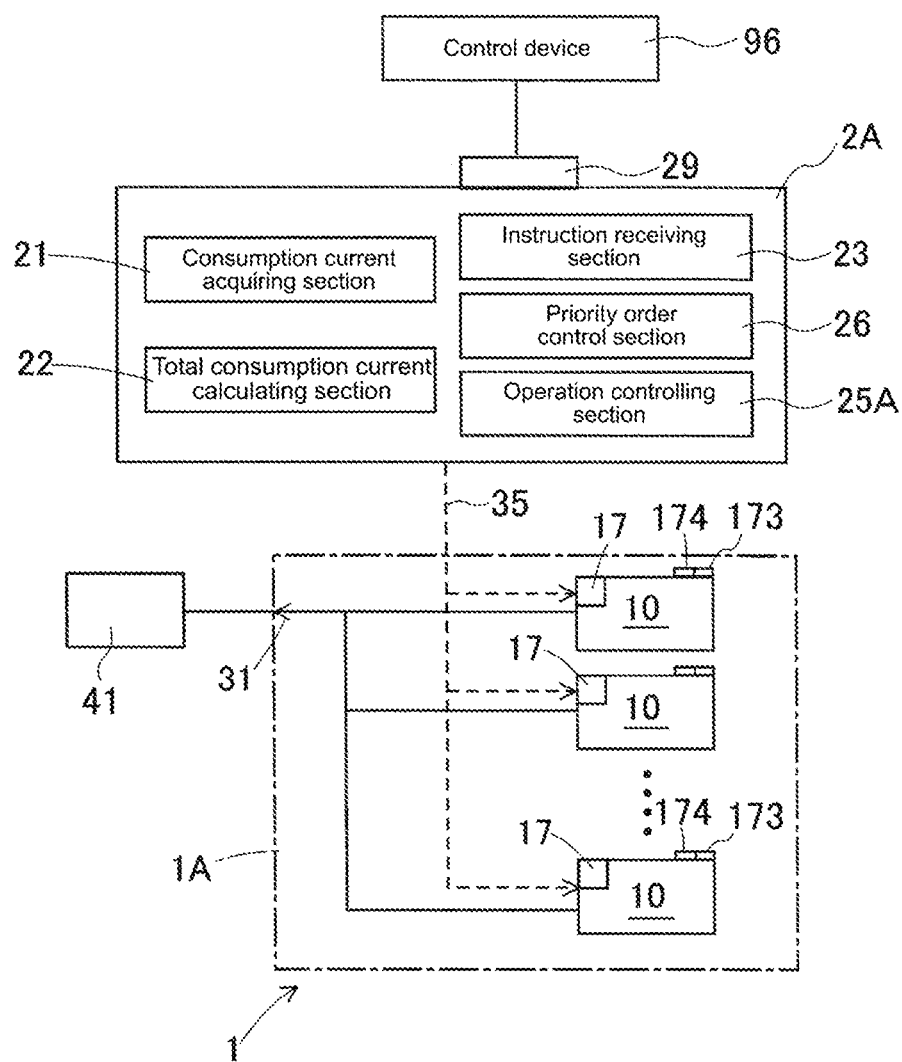
FIG. 8 is a block diagram illustrating the power supply control device of the component supply device of a second embodiment.

6. Configuration of Power Supply Control Device 2 of Component Supply Device 1 of a Second Embodiment Power supply control device 2A of component supply device 1 of a second embodiment is described next, with descriptions focusing on differences with the first embodiment. FIG. 8 is a block diagram illustrating power supply control device 2A of component supply device 1 of a second embodiment. In the second embodiment, the configuration of component supply device 1 is the same as in the first embodiment, the control details of power supply control device 2A are different. In the second embodiment, power supply control device 2A is configured integrally with machine-operation-use power supply device 41 and is used in internal changeover work. Also, it is assumed that component supply device 1 is loaded on component mounter 9 and is connected to machine-operation-use power supply device 41.

Power supply control device 2A of the second embodiment includes communication section 29 instead of setting command section 28, and is connected to control device 96 such that communication is possible. An example of an instruction from control device 96 to communication section 29 is an individual instruction for performing component supply operation at one of the loaded tape feeders 10. Because an individual instruction to communication section 29 and an individual instruction via command section 173 of tape feeder 10 are issued independently, they may overlap temporally.

Power supply control device 2A is provided with priority order control section 26 instead of determination order control section of the first embodiment, and the control details of operation controlling section 25A are different. Priority order control section 26, along with other functional sections 21, 22, 23, and 25A are realized by software. Priority order control section 26 decides priority order j for the multiple tape feeders 10 to perform the specified operation, and when receiving section 23 receives multiple individual instructions at the same time or receives an all-at-once instruction, sets the order in which to instruct the tape feeders 10 to perform operation in accordance with priority order j.

Priority order control section 26 gives high priority to tape feeders 10 that have received an instruction to perform component supply operation, gives medium priority to tape feeders 10 that have received an instruction to perform loading operation, and gives low priority to tape feeders 10 that have received an instruction to perform unloading operation. Further, priority order control section 26, when there are several medium priority tape feeders 10, decides priority based on the shortest time until being used in production of a board K. The configuration is not limited to this, and priority order control section 26 may decide the priority order based on usage frequency within the medium priority, in order of most-used first, or in order of closest to board K or component camera 95, or based on order of closest to a center point of the tape feeders 10 arranged in a line. Further, priority order control section 26 also decides the priority order among tape feeders 10 with a high priority and among tape feeders 10 with a low priority. Detailed functions and operation of priority control section 26 and operation controlling section 25A are described later.

Figure 9:
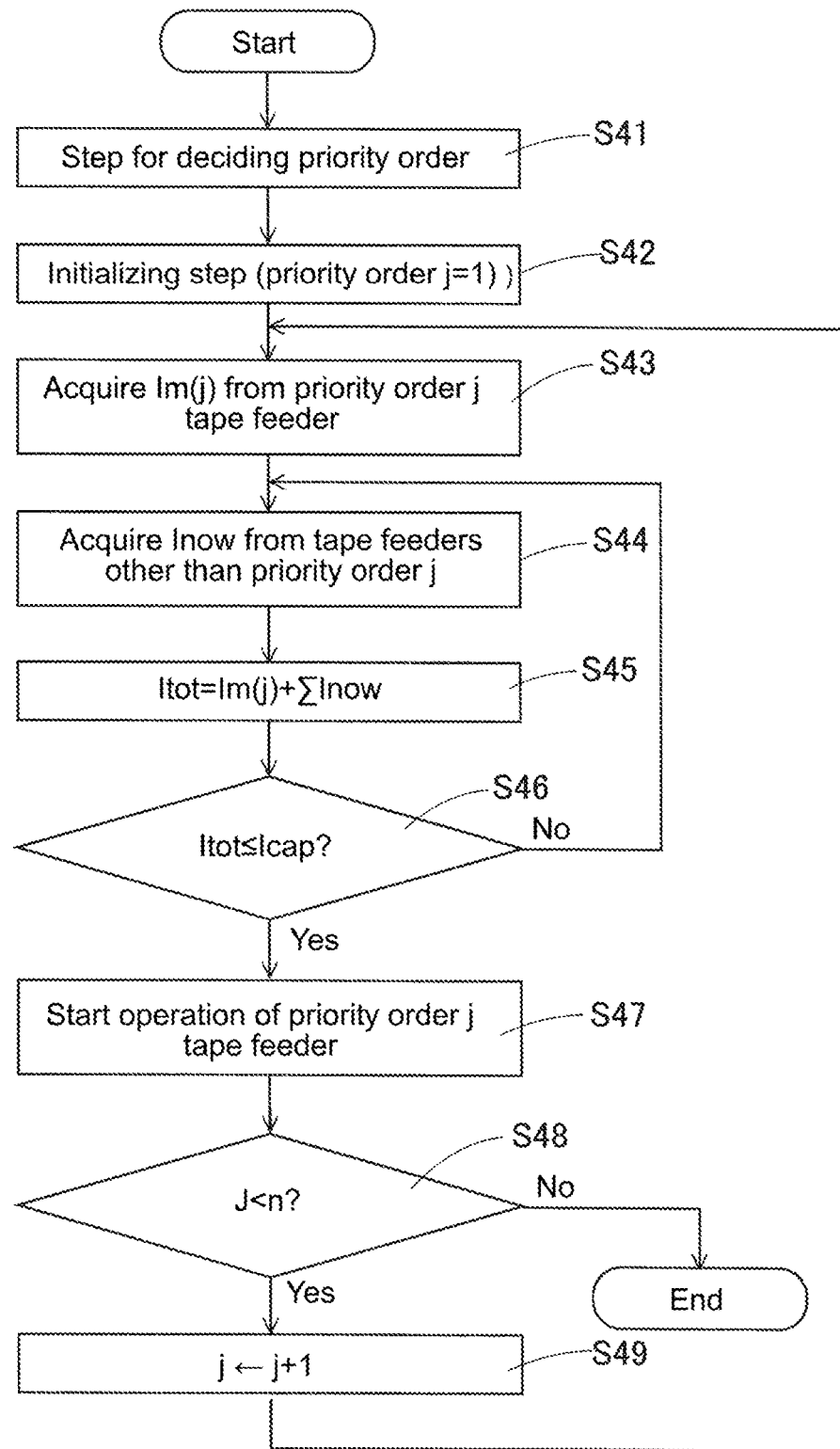
FIG. 9 is a flowchart of operation of the power supply control device of the second embodiment in a case when an instruction receiving section has received multiple individual instructions.

Operation of power supply control device 2A of the second embodiment is described next. FIG. 9 is a flowchart of operation of power supply control device 2A of the second embodiment in a case when instruction receiving section 23 has received multiple individual instructions. Here, it is assumed that n number of individual instructions has been received and the specified operation is to be performed at n tape feeders 10. In priority order deciding step S41 of FIG. 9, priority order control section 26 decides the priority order for multiple tape feeders 10 for which the specified operation has been requested. The priority order cannot be assigned to many tape feeders 10 regardless of the multiple individual instructions. In initializing step S42, priority order control section 26 sets j=1 as an initial value of priority order j of tape feeders 10.

In step S43, consumption current acquiring section 21 provisionally sets the operating state of tape feeder 10 of priority order j, and acquires operating consumption current Im(j). In step S44, consumption current acquiring section 21 acquires the current state consumption current Inow from tape feeders 10 other than priority order j. In step S45, total consumption current calculating section 22 calculates the total consumption current Itot using the following formula. Here, Σ is the symbol for "the sum of".

$$Itot=Im(j)+\Sigma(Inow)$$

In step S46, operation controlling section 25A determines whether the total consumption current Itot is sufficiently smaller than output current capacity Icap. The first time step S44 is performed, the total consumption current Itot is sufficiently smaller than output current capacity Icap, so processing proceeds to S47. In step S47, operation controlling section 25 issues an instruction to the priority order j tape feeder 10 to start operation. In step S48, priority order control section 26 determines whether priority order j has reached the nth number of individual instructions, in other words, whether all the individual instructions up to the nth number have been handled. If priority order j is smaller than n in step S49, priority order control section 26 increases the priority order j by one, makes the next priority order tape feeder 10 the target, and returns to step S43.

By repeating steps S43 to S48, operation controlling section A25 issues an instruction to tape feeders 10 to start operation for a quantity of feeders equal to the number of times the steps are repeated. By this, the total consumption current Itot gradually increases, and in step S46, the total consumption current Itot is no longer sufficiently smaller than the output current capacity Icap. In this case, processing returns to step S44 and steps S44 to S46 are repeated. It is rare for the total consumption current Itot to be no longer sufficiently smaller than the output current capacity Icap just from high priority tape feeders 10, and low priority tape feeders 10 are on standby, and in some cases, medium priority tape feeders 10 are also on standby.

While steps S44 to S46 are being repeated, if operation ends at one of the tape feeders 10 performing operation, the current state consumption current Inow decreases. Thus, the total consumption current Itot decreases, meaning the total consumption current Itot is sufficiently smaller than output current capacity Icap, such that processing progresses from step S46 to S47. By this, operation is started at medium and low priority tape feeders 10 that were on standby. By performing the above control operations, in step S48, when priority order j has reached the number n of individual instructions, power supply control device 2A ends operation.

Power supply control device 2A of component supply device 1 of the second embodiment further includes: priority order control section 26 configured to determine priority order j in which the multiple tape feeders 10 are to perform the specified operation, and to set the tape feeders 10 instructed to perform the specified operation in an order based on the priority order j when instruction receiving section 23 has received multiple of the individual instructions at the same time or has received the all-at-once instruction, wherein consumption current acquiring section 21 is configured to acquire the operating consumption current Im(j) corresponding to a supposed operation state when the specified operation is being performed by the tape feeders 10 instructed to perform the operation, and to acquire the consumption current Inow corresponding to a current state of the other tape feeders 10, total consumption current calculating section 22 is configured to calculate the total consumption current Itot by adding together the operating consumption current Im(j) of the tape feeders 10 instructed to perform the operation, and the consumption current Inow corresponding to the current state of the other tape feeders 10, and operation controlling section 25 is configured to perform the specified operation of the tape feeders 10 instructed to perform the operation if the total consumption current Itot is equal to or less than the output current capacity Icap, and to not perform the specified operation of the tape feeders instructed to perform the operation if the total consumption current Itot exceeds the output current capacity Icap.

Accordingly, when an instruction for operation is received for multiple tape feeders 10, many tape feeders 10 can be made to operate in accordance with the priority order such that total consumption current Itot is within a range that does not exceed output current capacity Icap.

Further, tape feeders 10 include first feeding motor 131 and second feeding motor 141 configured to feed carrier tape with tape electronic components from a supply reel, and the specified operation includes loading operation of loading the leading end of the carrier tape by driving first feeding motor 131 and second feeding motor 141, component supply operation of supplying components by driving first feeding motor 131 and second feeding motor 141 in a pitch-feeding manner, and unloading operation of ejecting the carrier tape from the tape feeder 10 by reverse-driving first feeding motor 131 and second feeding motor 141.

Accordingly, component supply operation of tape feeders 10 with a high priority can be performed with the highest priority, and loading operation that relates to component replenishment of tape feeders 10, which have medium priority, can be performed with the next highest priority. Accordingly, board production operation of component mounter 9 is interrupted less frequently, and production efficiency of boards is improved.

Figure 10:
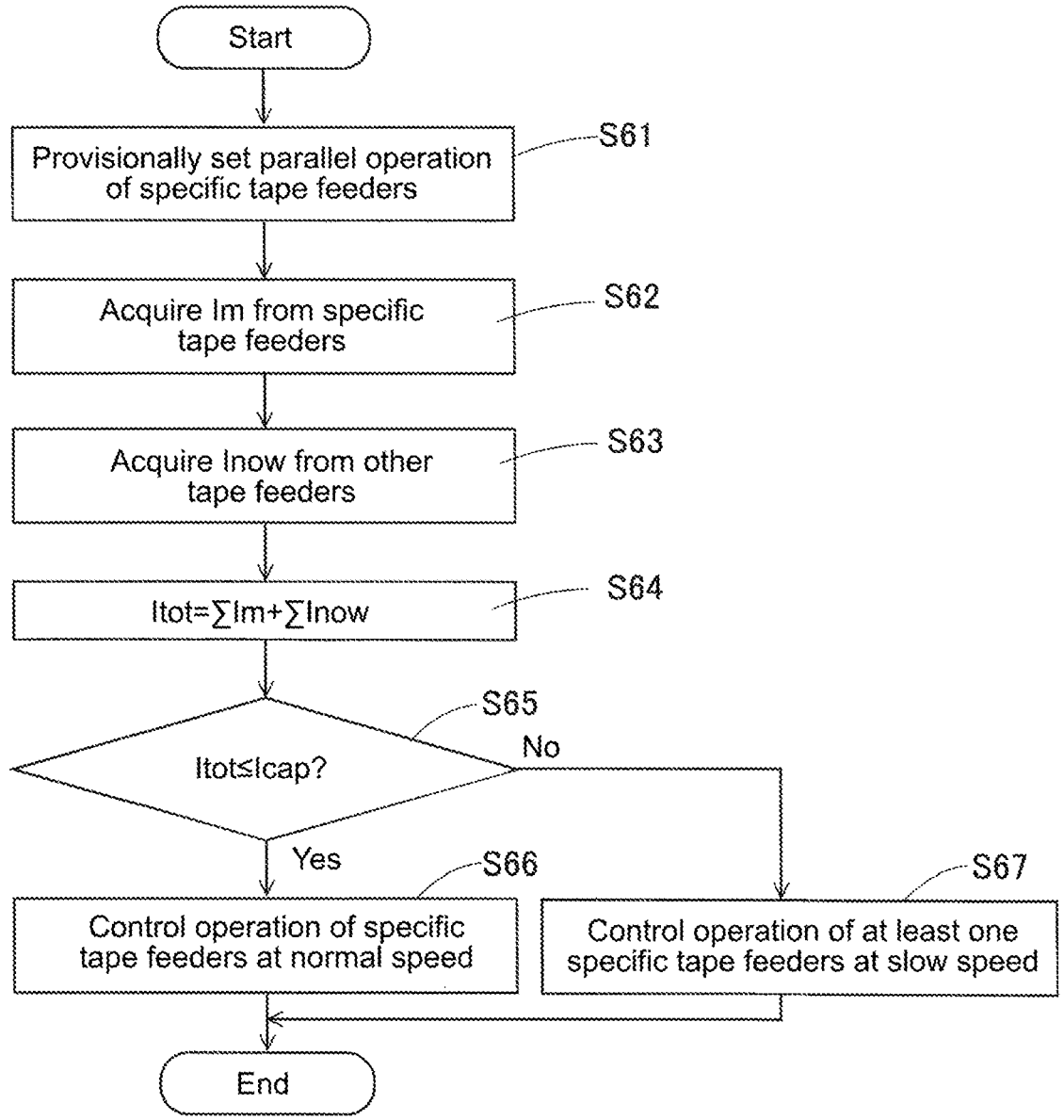
FIG. 10 is a flowchart of operation applied to a first application of the power supply control device of the second embodiment in a case when an instruction receiving section has received multiple individual instructions.

7. Application of Power Supply Control Device 2A of Component Supply Device 1 of a Second Embodiment Two applications of power supply control device 2A of component supply device 1 of the second embodiment are described next. In the first application, when there is a worry that an excess current will occur due to multiple individual instructions, the operating speed of the tape feeders 10 during the specified operation is made slower. In the first application, power supply control device 2A is provided with a parallel operation supposing section instead of priority order control section 26. FIG. 10 is a flowchart of operation applied to first application of power supply control device 2A of the second embodiment in a case when instruction receiving section 23 has received multiple individual instructions.

In step S61 of FIG. 10, the parallel operation supposing section supposes a case in which the specified operation is being performed by specific multiple tape feeders 10 (hereinafter also referred to as specific tape feeders 10) that correspond to the multiple individual instructions received by instruction receiving section 2. In step S62, consumption current acquiring section 21 supposes an operation state in which the specific tape feeders 10 are performing the specified operation and acquires the corresponding operating consumption current Im for each. In step S63, consumption current acquiring section 21 acquires the consumption current Inow corresponding to the current state of the other tape feeders 10. In step S64, total consumption current calculating section 22 calculates the total consumption current Itot using the following formula. Here, Σ is the symbol for "the sum of".

$$Itot=\Sigma(Im)+\Sigma(Inow)$$

In step S65, operation controlling section 25A determines whether the total consumption current Itot is sufficiently smaller than output current capacity Icap. If the total consumption current Itot is sufficiently smaller than output current capacity Icap in step S66, operation controlling section 25A controls operation of the specific tape feeders 10 at the normal speed. Here, the normal speed is the speed at which carrier tape is fed to the rear side, or the speed at which carrier tape is ejected to the front side. If the total consumption current Itot exceeds the output current capacity Icap in step S67, operation controlling section 25A controls at least one of the specific tape feeders 10 to perform the specified operation at a speed slower than the normal speed.

Accordingly, by making the operating speed (carrier tape feeding speed or ejecting speed) slower for at least one of the specific tape feeders 10, the actual operating consumption current is reduced, and the actual total consumption current can be made to be below the output current capacity Icap. In this case, all the specific tape feeders 10 may be made slower by substantially the same amount, or a portion of the specific tape feeders 10 may be made slower. Settings may be specified in advance to decide which of the specific tape feeders 10 to make slow and how slow to make the tape feeders 10. For example, if the relationship between reductions in speed of each tape feeder 10 and the size of reduction in the operating consumption current is determined in advance, the method for reducing the consumption current by the amount by which total consumption current Itot exceeds the output current capacity Icap can be set easily.

In the second application of power supply control device 2A of the second embodiment, when there is a worry that an excess current will occur due to multiple individual instructions, the operation timing for performing the specified operation of at least two of the specific tape feeders 10 may be shifted with respect to each other. In the second application, too, power supply control device 2A is provided with a parallel operation supposing section. Also, the operation flow for the second application is similar to the operation flow of the first application shown in FIG. 10, with only operation for step S67 being different.

In other words, instead of step S67, operation controlling section 25A shifts the timing for performing the specified operation for at least two of the specific tape feeders 10. Accordingly, it is possible to make the actual total consumption current less than the output current capacity Icap. In detail, generally, the operating consumption current is not fixed over time, and becomes a peak value when the feeding speed (or ejecting speed) of the carrier tape is increased, and is reduced with the feeding speed drops to a lower level. Accordingly, the specified operation of a first tape feeder 10 is performed in advance, the timing when the feeding speed will drop to a specified level is predicted, and the specified operation of the second tape feeder 10 is performed subsequently. Accordingly, because the timings of the occurrences of the peak value are shifted, the actual total consumption current can be reduced.

In the first application of power supply control device 2A of component supply device 1 of the second embodiment, further included is a parallel operation supposing section configured to suppose a case in which a specific quantity of the multiple tape feeders 10 are to perform the specified operation corresponding to the multiple individual instructions received by instruction receiving section 23, wherein consumption current acquiring section 21 is configured to acquire each operating consumption current Im corresponding to a supposed operation state when the specified operation is being performed by the specific quantity of the tape feeders 10, and to acquire the consumption current Inow corresponding to a current state of the other tape feeders 10, total consumption current calculating section 22 is configured to calculate the total consumption Itot current by adding together each operating consumption current Im of the specific quantity of the tape feeders 10, and the consumption current Inow corresponding to the current state of the other tape feeders 10, and operation controlling section 25A is configured to perform the specified operation of the specific quantity of the tape feeders 10 if the total consumption current Itot is equal to or less than the output current capacity Icap, and, if the total consumption current Itot exceeds the output current capacity Icap, make an actual total consumption current Itot equal to or less than the output current capacity Icap by reducing the actual operating consumption current by slowing an operation speed of the specified operation for at least one of the specific quantity of the tape feeders 10.

Accordingly, it is possible to handle all the received multiple individual instructions while avoiding an excess current, and board production efficiency and internal changeover efficiency are improved.

In the second application of power supply control device 2A of component supply device 1 of the second embodiment, further included is a parallel operation supposing section configured to suppose a case in which a specific quantity of the multiple tape feeders 10 are to perform the specified operation corresponding to the multiple individual instructions received by instruction receiving section 23, wherein consumption current acquiring section 21 is configured to acquire each operating consumption current Im corresponding to a supposed operation state when the specified operation is being performed by the specific quantity of the tape feeders 10, and to acquire the consumption current Inow corresponding to a current state of the other tape feeders 10, total consumption current calculating section 22 is configured to calculate the total consumption Itot current by adding together each operating consumption current Im of the specific quantity of the tape feeders 10, and the consumption current Inow corresponding to the current state of the other tape feeders 10, and operation controlling section 25 is configured to perform the specified operation of the specific quantity of the tape feeders 10 if the total consumption current Itot is equal to or less than the output current capacity Icap, and, if the total consumption current Itot exceeds the output current capacity Icap, make an actual total consumption current Itot equal to or less than the output current capacity Icap by reducing the actual operating consumption current by shifting the timing of performing the specified operation for at least two of the specific quantity of the tape feeders 10.

Accordingly, it is possible to handle all the received multiple individual instructions while avoiding an excess current, and board production efficiency and internal changeover efficiency are improved.

Figure 11:
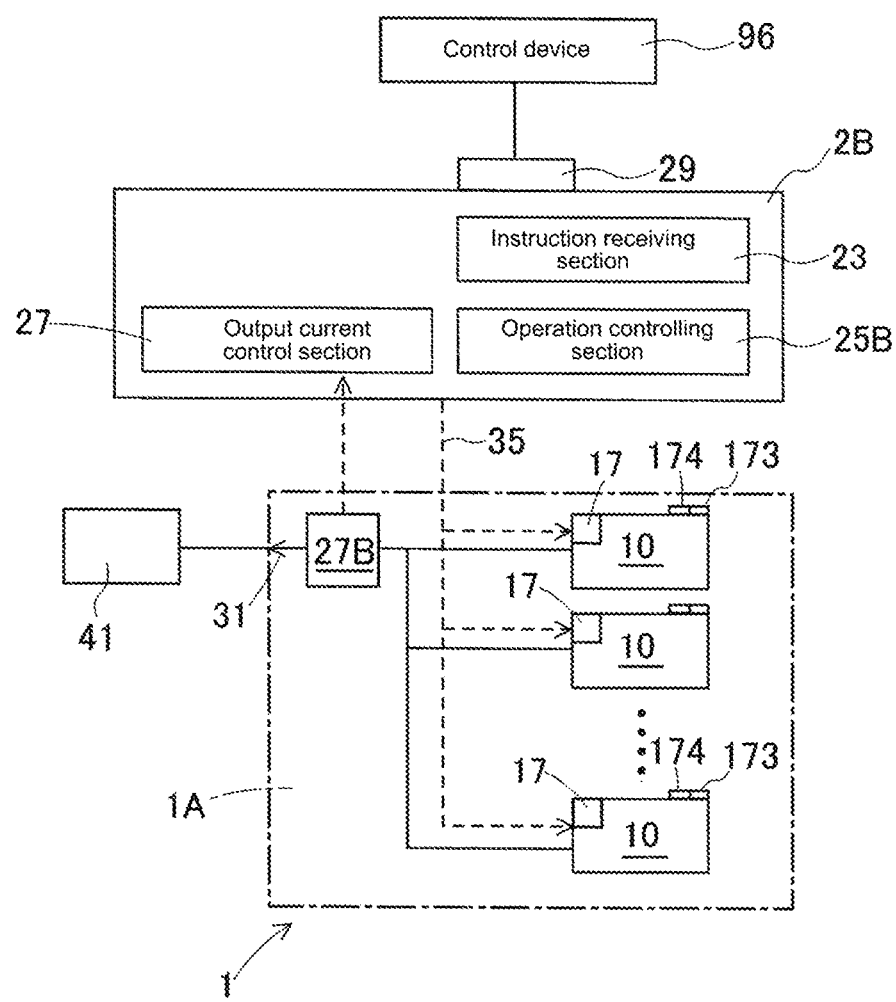
FIG. 11 is a block diagram illustrating the power supply control device of the component supply device of a third embodiment.

8. Configuration of Power Supply Control Device 2B of Component Supply Device 1 of a Third Embodiment Power supply control device 2B of component supply device 1 of a third embodiment is described next, with descriptions focusing on differences with the first and second embodiments. In the third embodiment, the total consumption current Itot is monitored by being measured. FIG. 11 is a block diagram illustrating power supply control device 2B of component supply device 1 of the third embodiment. As shown, power supply control device 2B of the third embodiment is configured from items such as instruction receiving section 23, operation controlling section 25B, output current limiting section 27, and total consumption current measuring section 27B.

Output current limiting section 27 is realized by software. Output current limiting section 27 limits the actual total consumption current Itot to be equal to or less than the output current capacity Icap of machine-operation-use power supply device 41. Details regarding functions and operations of output current limiting section 27 are described later. Total consumption current measuring section 27B is provided on pallet table 1A. Total consumption current measuring section 27B, for example, directly measures the total consumption current output from machine-operation-use power supply device 41 via a shunt resistor. Information of the measurement values of total consumption current measuring section 27B is acquired by output current limiting section 27.

Operation controlling section 25B makes tape feeders 10 perform operation consecutively in accordance with the individual instructions or all-at-one instruction received by instruction receiving section 23. During this time, output current limiting section monitors changes in the total consumption current Itot. And, if the total consumption current Itot reaches the output current capacity Icap, output current limiting section 27 controls operation controlling section 25B, or performs control together with operation controlling section 25B, such that the actual total consumption current Itot is limited to being equal or less than the output current capacity Icap.

For example, as a specific method for limiting the total consumption current Itot, output current limiting section 27 may use the method of slowing the operating speed of tape feeders as described in the first application of the second embodiment. Or, for example, as a specific method, the method of shifting the timing for performing operation for two tape feeders 10 as described in the second application of the second embodiment may be used. Further, as a specific method, considering the priority order described in the second embodiment, tape feeders 10 with a low priority may be forcibly stopped.

Power supply control device 2B of component supply device 1 of the third embodiment is for controlling a consumption current supplied from a power supply device (machine-operation-use power supply device 41) to multiple tape feeders 10, component supply device 1 being exchangeably loaded with multiple of the tape feeders 10 to which the consumption current is supplied and that perform a specified operation, power supply control device 2B including: output current limiting section 27 configured to limit an actual total consumption current Itot obtained by adding together the consumption current output to the multiple tape feeders from the power supply device to a current equal to or less than an output current capacity Icap of the power supply device.

Accordingly, because the total consumption current Itot is measured, the worry of an excess current state occurring is reliably eliminated, and because the total consumption current Itot is reliably increased up to a limit of the output current capacity Icap, board production efficiency and efficiency of changeover work of tape feeders 10 are improved by a great extent.

9. Applications and Alternative Embodiments

Note that, with the present disclosure, control may be performed using the consumption current of tape feeders 10, but the electricity consumption of the tape feeders 10 or the required power supply capacity may be used instead of the consumption current, with similar effects being achieved. Also, the present disclosure may be applied to tape feeders 10 with a configuration different to one with two motors, feeding motor 131 and feeding motor 141. Various other applications and modifications are possible for the present disclosure.

REFERENCE SIGNS LIST

1: component supply device; 10: tape feeder; 11: main body section; 13: front tape feeding mechanism; 131: first feeding motor; 14: rear tape feeding mechanism; 141: second feeding motor; 17: control device; 173: command section; 174: display section; 1A: pallet member; 2, 2A, 2B: power supply control device; 21: consumption current acquiring section; 22: total consumption current calculating section; 23: instruction receiving section; 24: determination order control section; 25, 25A, 25B: operation controlling section; 26: priority order control section; 27: output current limiting section; 27B: total consumption current measuring section; 28: setting command section; 29: communication section; 35: control wire; 41: machine-operation-use power supply device; 42: changeover-use power supply device; 9: component mounter; 92: board conveyance device; 94: component supply device; 95: component camera; 96: control device; Icap: output current capacity; Itot: total consumption current; Im, Im(k), Im(j), Im(x): operating consumption current; Inow: current state consumption current

The invention claimed is:

1. A power supply control device of a component supply device for controlling a consumption current supplied from a power supply device to a tape feeder loaded on the component supply device, the component supply device being exchangeably loaded with multiple of the tape feeders to which the consumption current is supplied and that perform an unloading operation of ejecting a carrier tape from the tape feeder by reverse driving a motor of the tape feeder, the power supply control device comprising:

processing circuitry configured to:
acquire the consumption current corresponding to a state of each of the multiple tape feeders loaded on the component supply device based on a measured value or a design value, each of the multiple tape feeders corresponding to one of a first state in which the unloading operation is not being performed but current is being consumed and a second state in which the unloading operation is being performed or is being prepared to be performed;
calculate a total consumption current that is a total of each of the consumption currents corresponding to the multiple tape feeders including a first consumption current for every tape feeder corresponding to the first state and a second consumption current for every tape feeder corresponding to the second state; and control the unloading operation of the multiple tape feeders within a range in which the total consumption current does not exceed an output current capacity of the power supply device.

2. The power supply control device according to claim 1, wherein the first state is a standby state, the first consumption current is a standby consumption current, the second state includes a preparation state of preparing for the unloading operation or an operating state in which the unloading operation is being performed, the second consumption current includes a preparation consumption current or an operating consumption current, the consumption current corresponding to the state of the tape feeder includes the standby consumption current corresponding to the standby state, the preparation consumption current corresponding to the preparation state, and the operating consumption current corresponding to the operating state, and the processing circuitry determines or supposes which of the standby state, the preparation state, and the operating state the multiple tape feeders are in, and acquires the corresponding one of the standby consumption current, the preparation consumption current, and the operating consumption current.

3. The power supply control device according to claim 2, wherein the processing circuitry is configured to receive at least one of an individual instruction for performing the unloading operation at one of the multiple tape feeders, or an all-at-once instruction for performing the unloading operation at all of the multiple tape feeders.

4. The power supply control device according to claim 3, wherein the processing circuitry is configured to hold a determination order that determines whether the unloading operation of the multiple tape feeders is to be performed, and to set an order in which to instruct the tape feeders to perform the operation based on the determination order when the processing circuitry has received multiple of the individual instructions at the same time or has received the all-at-once instruction, the processing circuitry is configured to acquire the operating consumption current corresponding to a supposed operation state when the unloading operation is being performed by the tape feeders instructed to perform the operation, and to acquire the consumption current corresponding to a current state of the other tape feeders, the processing circuitry is configured to calculate the total consumption current by adding together the operating consumption current of the tape feeders instructed to perform the operation, and the consumption current corresponding to the current state of the other tape feeders, and the processing circuitry is configured to perform the unloading operation of the tape feeders instructed to perform the operation if the total consumption current is equal to or less than the output current capacity, and to not perform the unloading operation of the tape feeders instructed to perform the operation if the total consumption current exceeds the output current capacity.

5. The power supply control device according to claim 3, wherein the processing circuitry is configured to determine a priority order in which the multiple tape feeders are to perform the unloading operation, and to set the tape feeders instructed to perform the unloading operation in an order based on the priority order when the processing circuitry has received multiple of the individual instructions at the same time or has received the all-at-once instruction, the processing circuitry is configured to acquire the operating consumption current corresponding to a supposed operation state when the unloading operation is being performed by the tape feeders instructed to perform the operation, and to acquire the consumption current corresponding to a current state of the other tape feeders, the processing circuitry is configured to calculate the total consumption current by adding together the operating consumption current of the tape feeders instructed to perform the operation, and the consumption current corresponding to the current state of the other tape feeders, and the processing circuitry is configured to perform the unloading operation of the tape feeders instructed to perform the operation if the total consumption current is equal to or less than the output current capacity, and to not perform the unloading operation of the tape feeders instructed to perform the operation if the total consumption current exceeds the output current capacity.

6. The power supply control device according to claim 3, wherein the processing circuitry is configured to suppose a case in which a specific quantity of the multiple tape feeders are to perform the unloading operation corresponding to multiple individual instructions, the processing circuitry is configured to acquire the operating consumption current corresponding to a supposed operation state when the unloading operation is being performed by the specific quantity of the tape feeders, and to acquire the consumption current corresponding to a current state of the other tape feeders, the processing circuitry is configured to calculate the total consumption current by adding together the operating consumption current of the specific quantity of the tape feeders, and the consumption current corresponding to the current state of the other tape feeders, and the processing circuitry is configured to perform the unloading operation of the specific quantity of the tape feeders if the total consumption current is equal to or less than the output current capacity, and, if the total consumption current exceeds the output current capacity, make an actual total consumption current equal to or less than the output current capacity by reducing an actual operating consumption current by slowing an operation speed of the unloading operation for at least one of the specific quantity of the tape feeders.

7. The power supply control device according to claim 3, wherein the processing circuitry is configured to suppose a case in which a specific quantity of the multiple tape feeders are to perform the unloading operation corresponding to multiple individual instructions, the processing circuitry is configured to acquire the operating consumption current corresponding to a supposed operation state when the unloading operation is being performed by the specific quantity of the tape feeders, and to acquire the consumption current corresponding to a current state of the other tape feeders, the processing circuitry is configured to calculate the total consumption current by adding together the operating consumption current of the specific quantity of the tape feeders, and the consumption current corresponding to the current state of the other tape feeders, and the processing circuitry is configured to perform the unloading operation of the specific quantity of the tape feeders if the total consumption current is equal to or less than the output current capacity, and, if the total consumption current exceeds the output current capacity, make an actual total consumption current equal to or less than the output current capacity by reducing an actual operating consumption current by slowing an operation speed of the unloading operation for at least one of the specific quantity of the tape feeders.

8. The power supply control device according to claim 3, wherein the tape feeder includes an individual instruction receiving section configured to receive the individual instruction via an operator command and send the individual instruction to the processing circuitry, and a notification section configured to notify the operator of a delay or a cancellation to the unloading operation in a case in which the operator command has been issued and the unloading operation has been stopped by the processing circuitry.

9. The power supply control device according to claim 1, wherein the processing circuitry is configured to perform communication with the multiple tape feeders, and to receive a value of a consumption current corresponding to a current state from the tape feeders with which communication was performed, or a value of an operating consumption current corresponding to a case supposing an operating state in which the unloading operation is being performed.

10. The power supply control device according to claim 1, wherein the processing circuitry is configured to hold a consumption current by state and type table showing relationships between unit types of the tape feeders, the states of the tape feeders, and the consumption currents of the tape feeders, request the multiple tape feeders for a unit type and a current state and receive a reply from the requested tape feeders of the unit type and the current state, or, suppose an operating state of the multiple tape feeders performing the unloading operation, request the multiple tape feeders for the unit type of the tape feeders, and receive a reply from the requested tape feeders of the unit type, and reference the received reply with the consumption current by state and type table, and acquire the consumption current corresponding to the state of the requested tape feeders.

11. The power supply control device according to claim 1, wherein the processing circuitry is configured to hold a consumption current by state and individual unit table showing relationships between identification codes that identify individual units of the tape feeders, the states of the tape feeders, and the consumption currents of the tape feeders, request the multiple tape feeders for an identification code and a current state and receive a reply from the requested tape feeders of the identification code and the current state, or, suppose an operating state of the multiple tape feeders performing the unloading operation, request the multiple tape feeders about the identification code of the tape feeders, and receive a reply from the requested tape feeders of the identification code, and reference the received reply with the consumption current by state and individual unit table, and acquire the consumption current corresponding to the state of the requested tape feeders.

12. The power supply control device according to claim 1, wherein the tape feeder includes a feeding motor configured to feed the carrier tape with taped electronic components from a supply reel, and the unloading operation includes reverse-driving the feeding motor.

13. The power supply control device according to claim 12, wherein the processing circuitry, in a case of performing the unloading operation at multiple of the tape feeders, divides the multiple tape feeders into feeder sets configured from at least two tape feeders, and makes it such that the total consumption current obtained by adding together an operating consumption current corresponding to the second state, and a standby consumption current corresponding to the first state is in a range that does not exceed the output current capacity, and performs the unloading operation in individual order of the feeder sets.

14. The power supply control device according to claim 13, wherein the processing circuitry is configured to optimize combinations of the tape feeders that configure the feeder sets.

15. The power supply control device according to claim 1, wherein the power supply device is a power supply device for machine operations inside a component mounter in a case in which the component supply device is loaded on the component mounter, and is a power supply device for external changeover in a case in which the component supply device is removed from the component mounter.

16. A power supply control device of a component supply device for controlling a consumption current supplied from a power supply device to multiple tape feeders, the component supply device being exchangeably loaded with multiple of the tape feeders to which the consumption current is supplied and that perform an unloading operation of ejecting a carrier tape from the tape feeder by reverse driving a motor of the tape feeder, the power supply control device comprising:

processing circuitry configured to limit an actual total consumption current obtained by adding together the consumption current output to each of the multiple tape feeders, including a first consumption current for every tape feeder of the tape feeders corresponding to a first state in which the unloading operation is not being performed but current is being consumed and a second consumption current for every tape feeder corresponding to a second state in which the unloading operation is being performed or is being prepared to be performed, from the power supply device to a current equal to or less than an output current capacity of the power supply device.

17. A power supply control method for a component supply device for controlling a consumption current supplied from a power supply device to multiple tape feeders, the component supply device being exchangeably loaded with multiple of the tape feeders to which the consumption current is supplied and that perform an unloading operation of ejecting a carrier tape from the tape feeder by reverse driving a motor of the tape feeder, the power supply control method comprising:

acquiring the consumption current corresponding to a state of each the multiple tape feeders based on a measured value or a design value, each of the multiple tape feeders corresponding to one of a first state in which the unloading operation is not being performed but current is being consumed and a second state in which the unloading operation is being performed or is being prepared to be performed;

calculating a total consumption current that is a total of the consumption currents of each of the multiple tape feeders including a first consumption current for every tape feeder corresponding to the first state and as second state consumption current for every tape feeder corresponding to the second state; and controlling the unloading operation of the multiple tape feeders within a range in which the total consumption current does not exceed an output current capacity of the power supply device.

18. The power supply control device according to claim 1, wherein
the processing circuitry is configured to use a total value of the first consumption currents of each of the multiple feeders as an initial value of the total consumption current in the control of the unloading operation of the multiple tape feeders.

19. The power supply control device according to claim 1, wherein
the first state is a standby state,
the first consumption current is a standby consumption current, and
the processing circuitry is configured to use a total value of the standby consumption currents of each of the multiple feeders as an initial value of the total consumption current in the control of the unloading operation of the multiple tape feeders.

20. The power supply control device according to claim 15, wherein the processing circuitry is configured to control the unloading operation of the multiple tape feeders within the range in which the total consumption current does not exceed the output current capacity of the power supply device while the component supply device is removed from the component mounter.

* * * * *